United States Patent
Balakrishnan et al.

(10) Patent No.: US 8,213,243 B2
(45) Date of Patent: Jul. 3, 2012

(54) PROGRAM CYCLE SKIP

(75) Inventors: Gopinath Balakrishnan, San Jose, CA (US); Luca Fasoli, Campbell, CA (US); Tz-Yi Liu, Palo Alto, CA (US); Yuheng Zhang, Saratoga, CA (US); Yan Li, Milpitas, CA (US)

(73) Assignee: SanDisk 3D LLC, Milpitas, CA (US)

( * ) Notice: Subject to any disclaimer, the term of this patent is extended or adjusted under 35 U.S.C. 154(b) by 324 days.

(21) Appl. No.: 12/638,729

(22) Filed: Dec. 15, 2009

(65) Prior Publication Data

US 2011/0141832 A1   Jun. 16, 2011

(51) Int. Cl.
*G11C 7/00* (2006.01)

(52) U.S. Cl. ........ 365/189.16; 365/189.05; 365/189.011

(58) Field of Classification Search ............. 365/189.16, 365/189.05, 189.011
See application file for complete search history.

(56) References Cited

U.S. PATENT DOCUMENTS

| | | | |
|---|---|---|---|
| 4,926,312 A | 5/1990 | Nukiyama | |
| 6,029,226 A | 2/2000 | Ellis | |
| 6,928,590 B2 * | 8/2005 | Ilkbahar et al. | 714/49 |
| 7,219,271 B2 * | 5/2007 | Kleveland et al. | 714/718 |
| 7,243,203 B2 | 7/2007 | Scheuerlein | |
| 7,383,476 B2 * | 6/2008 | Crowley et al. | 714/723 |
| 7,490,283 B2 | 2/2009 | Gorobets | |
| 7,502,260 B2 * | 3/2009 | Li | 365/185.12 |
| 7,545,689 B2 * | 6/2009 | Ilkbahar et al. | 365/200 |
| 7,804,724 B2 * | 9/2010 | Way | 365/189.16 |
| 7,966,532 B2 * | 6/2011 | Bottelli et al. | 714/723 |
| 2001/0005876 A1 | 6/2001 | Srinivasan | |
| 2001/0017798 A1 | 8/2001 | Ishii | |
| 2002/0041527 A1 | 4/2002 | Tanaka | |
| 2002/0136045 A1 | 9/2002 | Scheuerlein | |
| 2004/0250183 A1 | 12/2004 | Crowley | |
| 2004/0255088 A1 | 12/2004 | Scheuerlein | |
| 2009/0244987 A1 | 10/2009 | Cernea | |
| 2011/0047330 A1 * | 2/2011 | Potapov et al. | 711/114 |

FOREIGN PATENT DOCUMENTS

WO   WO2006/130438   12/2006

OTHER PUBLICATIONS

PCT International Search Report dated May 17, 2011, PCT Patent Application No. PCT/US2010-060155.
PCT Written Opinion of the International Searching Authority dated May 17, 2011, PCT Patent Application No. PCT/ US2010-060155.

* cited by examiner

*Primary Examiner* — Viet Q Nguyen
(74) *Attorney, Agent, or Firm* — Vierra Magen Marcus & DeNiro LLP

(57) ABSTRACT

A non-volatile storage system includes technology for skipping programming cycles while programming a page (or other unit) of data. While programming a current subset of the page (or other unit) of data, the system will evaluate whether the next subsets of the page (or other unit) of data should be programmed into non-volatile storage elements or skipped. Subsets of the page (or other unit) of data that should not be skipped are programmed into non-volatile storage elements. Some embodiments include transferring the appropriate data to temporary latches/registers, in preparation for programming, concurrently with the evaluation of whether to program or skip the programming.

23 Claims, 14 Drawing Sheets

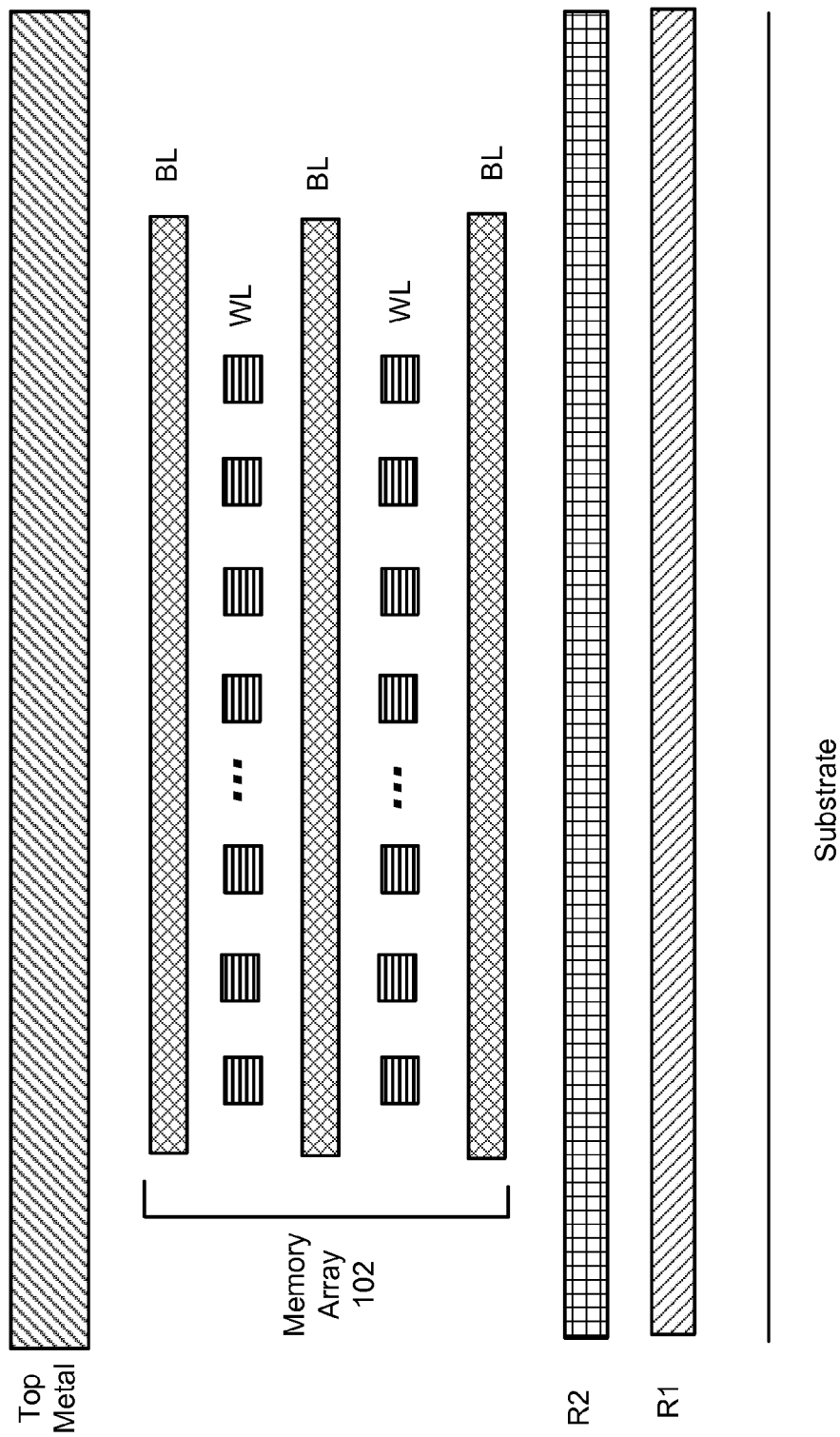

PROGRAM CYCLE SKIP

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. As the amount of data that a user wants to store gets larger, there is a demand for higher density storage. Three dimensional memories are one example of higher density storage. However, higher density should not be achieved at the cost of lower performance.

BRIEF DESCRIPTION OF THE DRAWINGS

FIG. 5 is a block diagram depicting various layers of a three dimensional memory array.

DETAILED DESCRIPTION

A three dimensional memory system is proposed that provides high density storage. During a programming process, data to be programmed into the memory is transferred to an intermediate register prior to programming the data into the appropriate memory cells. Because the number of bits of data that can be simultaneously programmed into the memory cells is less than the total amount of data that needs to be programmed, the memory system divides the data to be programmed into groups of data and sequentially programs the groups of data. While programming a currently chosen group of data, the memory system will evaluate the next group of data to be programmed to determine whether to skip the programming of the next group of data. For example, if the next group of data to be programmed matches the data already in the target memory cells, then there is no need to program the next group of data. By skipping redundant programming cycles, the overall programming process will complete faster. If the memory system determines that the programming of the next group of data can be skipped, then the memory system will evaluate one or more additional groups of data to be programmed to determine whether to skip the one or more additional groups of data. The evaluation of the one or more additional groups of data is performed without waiting for the programming of the currently chosen group of data to complete.

Figure 1:
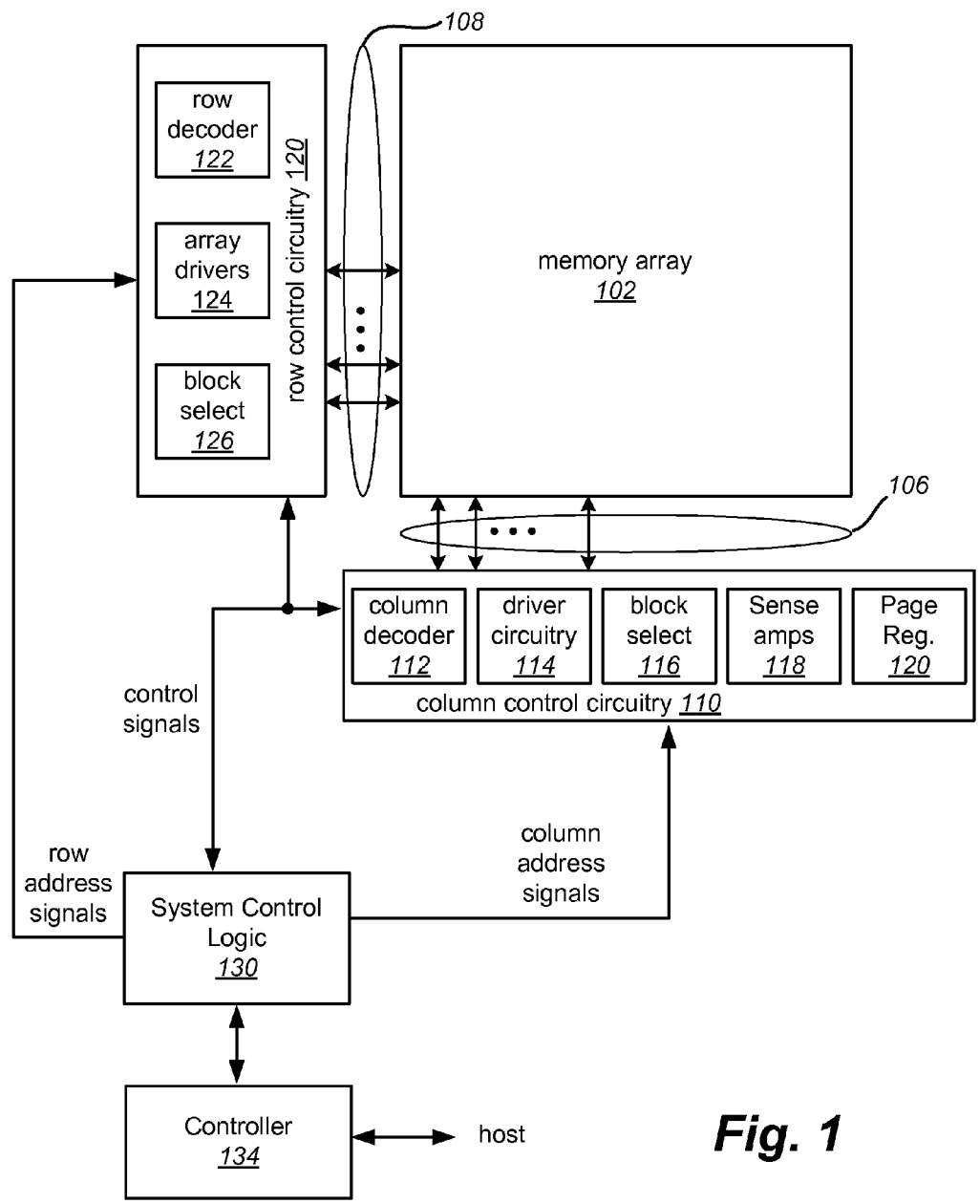
FIG. 1 is a block diagram of one embodiment of a memory system.

FIG. 1 is a block diagram that depicts one example of a memory system 100 that can implement the technology described herein. Memory system 100 includes a memory array 102, which can be a two or three-dimensional array of memory cells. In one embodiment, memory array 102 is a monolithic three-dimensional memory array. The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. For purposes of this document, a connection can be a direct connection or indirect connection (e.g., via one or more other parts). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130. In some embodiments, column control circuitry 110 may receive data signals. Column control circuitry 110 include such circuits as column decoders 112, driver circuitry 114, block select circuitry 116, sense amplifiers 118 and page register 120. In one embodiment, sense amplifiers 118 provide signals to the bit lines and sense signals on the bit lines. Various sense amplifiers known in the art can be used herein.

System control logic 130 receives data and commands from controller 134 and provides output data and status to controller 134. Controller 134 communicates with the host (e.g., camera, computer, cell phone, ect.). System control logic 130 may include one or more state machines, registers and other control logic for controlling the operation of memory system 100. In other embodiments, system control logic 130 receives data and commands directly from a host and provides output data to that host, because system control logic 130 (in this embodiment) includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above at least a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. Nos. 6,879,505; 7,286,439; 6,856,572; and 7,359,279. Controller 134 can be on the same substrate as or a different substrate than the other components depicted in FIG. 1. Controller 134, system control logic 130, column control circuitry 110, and row control circuitry 120, alone or in any combination, can be thought of as one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. Nos. 6,034,882; 6,525,953; 6,952,043; 6,420,215; 6,951,780; and 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistivity that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
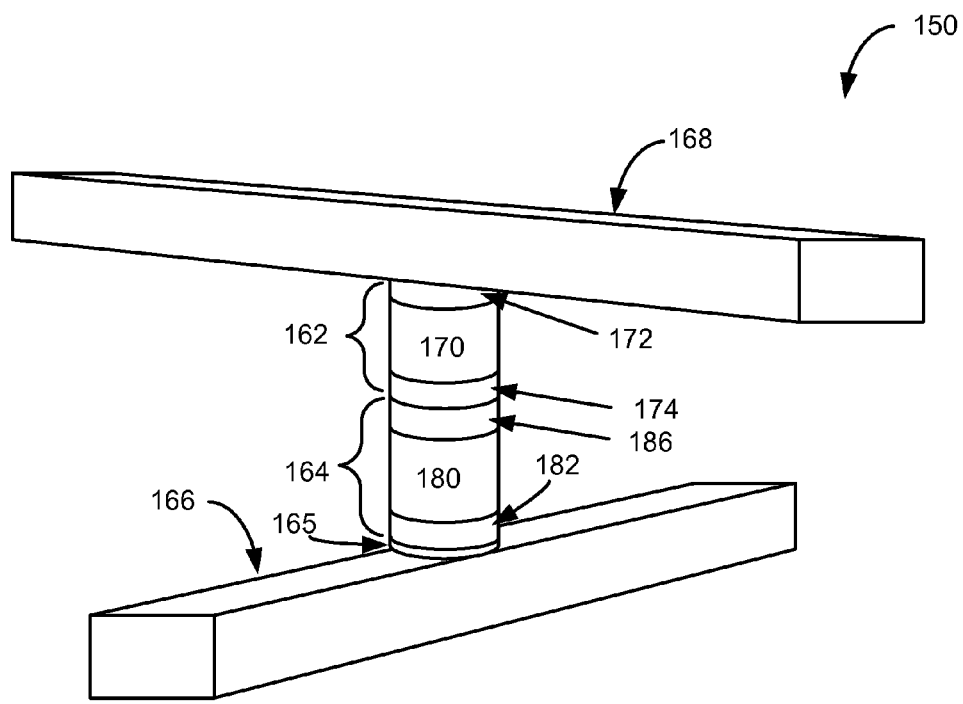
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO—, $NiO_x$— or $NiO_xP_y$—containing layer may be selectively deposited above the steering element using a selective deposition process and then annealed and/or oxidized (if necessary).

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_1$—$XCa_xMnO_3$ (PCMO), $La_1$—$XCa_xMnO_3$ (LCMO), $LaSrMnO_3$ (LSMO), or $GdBaCo_xO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass.

Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in U.S. patent application Ser. No. 12/339,313, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
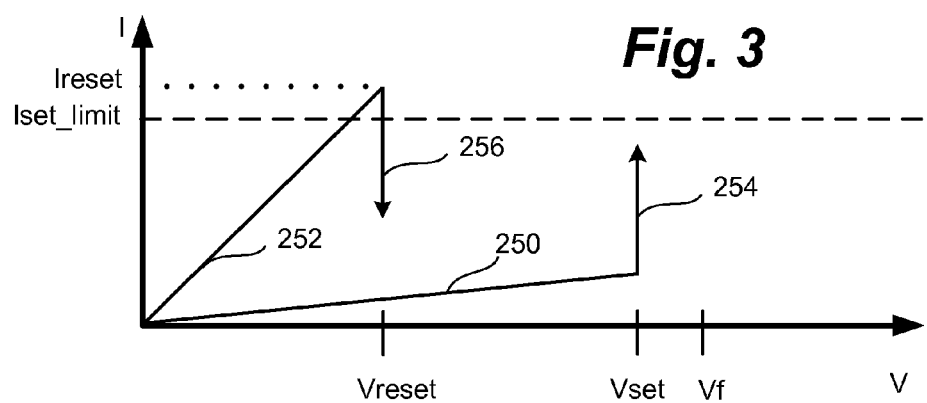
FIG. 3 is a graph depicting I-V characteristics of a reversible resistance-switching element used in one example of a memory cell.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Reset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Reset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in U.S. patent application Ser. No. 12/339,313, "Reverse Set With Current Limit for Non-Volatile Storage," filed on Dec. 19, 2008, incorporated herein by reference in its entirety; United States Patent Application 2007/0072360, incorporated herein by reference in its entirety; and U.S. Patent Application 2007/0008785, incorporated herein by reference in its entirety.

In some implementations, the SET and RESET operations (also called programming operations) can be followed by a verify operation to see if the SET operation was successful. If not, the programming operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated. In some cases, the data is programmed a logical page at a time; therefore, if the verify operation indicates that the programming operation was not successful, then the entire page may be re-programmed.

Figure 4A:
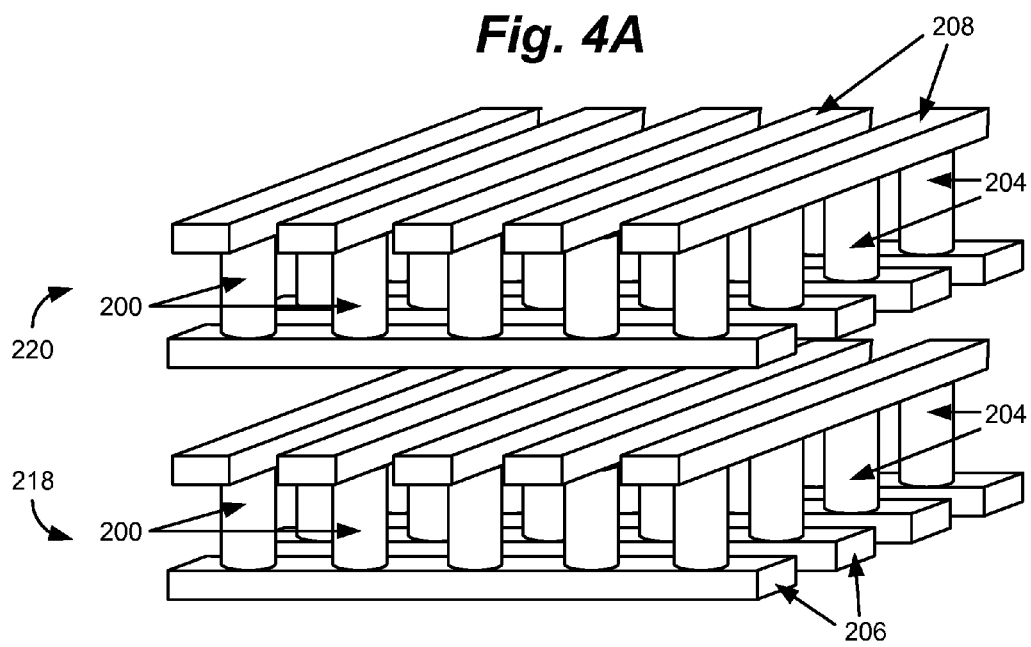
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between, above or below the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
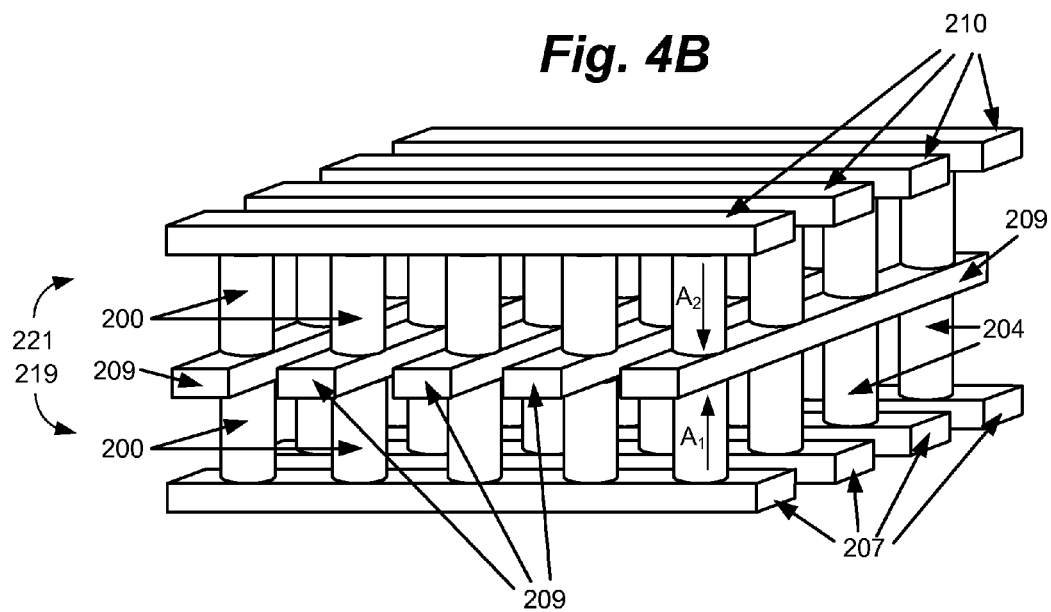
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952, 030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

As mentioned above, FIGS. 4A and 4B show a portion of a monolithic three-dimensional memory array. As can be seen, the bit lines are arranged in a first direction and the word lines are arranged in a second direction perpendicular to the bit lines. In a memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above at least a portion of the supporting circuitry. FIG. 5, which depicts various layers of an integrated circuit, shows the Memory Array 102 positioned above the Substrate. The Memory Array includes bit line layers BL and word line layers WL. FIG. 5 only shows three bit line layers BL and two word line layer WL; however, in other embodiments, additional bit line and word line layers can be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5 shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5 shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than two or more layers (in which case the zia looks like a staircase).

Figure 6:
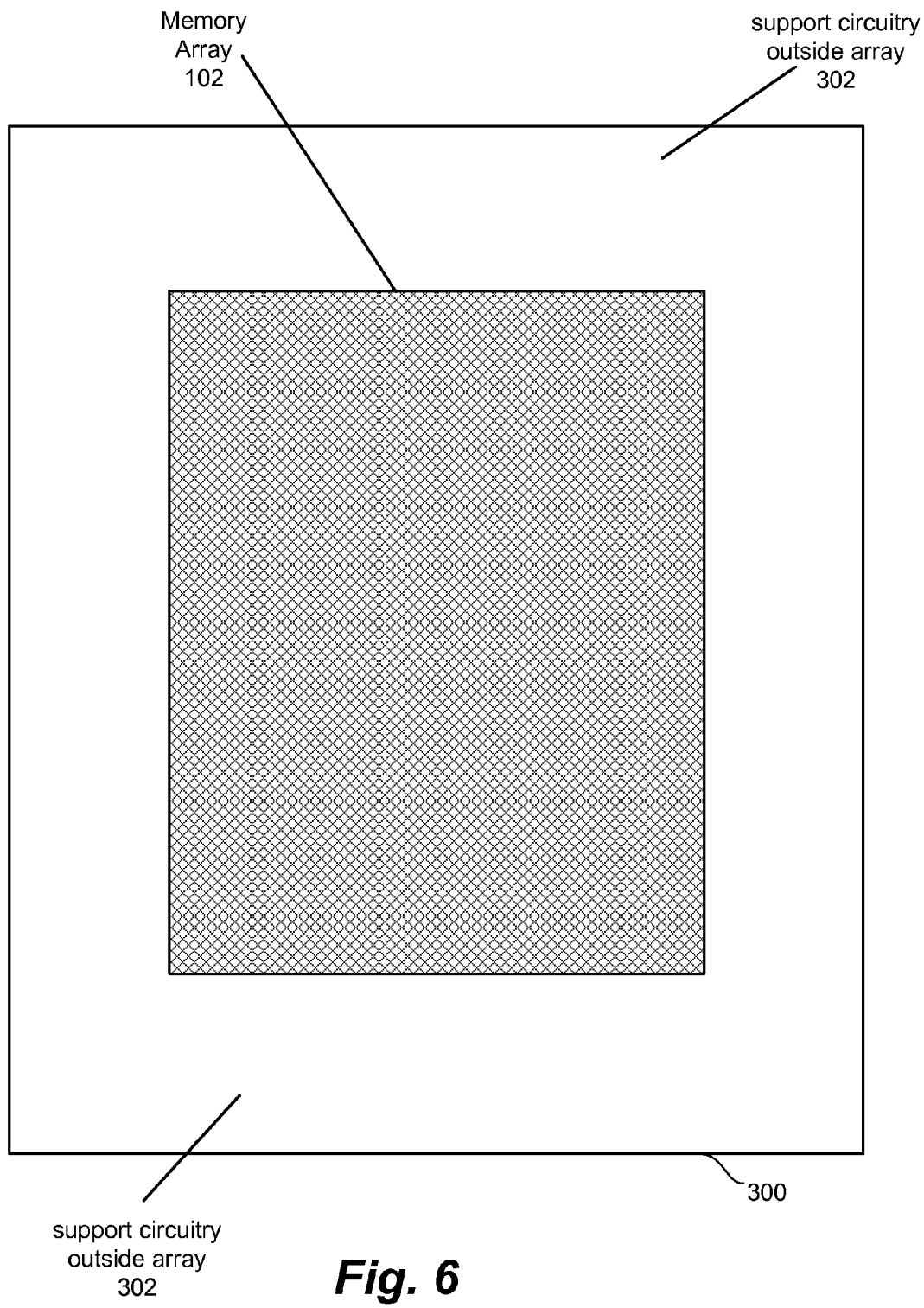
FIG. 6 is a top view of a substrate having a memory system implemented thereon.

FIG. 6 is a top view of a substrate 300 used to implement memory system 100. FIG. 6 shows a top view looking down on substrate 300. In one embodiment, the support circuitry for memory 102 is fabricated on the top surface of substrate 300. The monolithic three-dimensional memory array 102 is arranged above the surface of substrate 300, and above a portion of the support circuitry. Therefore, some of the support circuitry is arranged below memory array 102 and some of the support circuitry 302 is arranged on substrate 300 in an area that is not underneath the monolithic three-dimensional memory array 102. The support circuitry below memory array 102 cannot be seen in the view of FIG. 6 because it is occluded by memory array 102. Note that the use of the terms "above" and "below" are relative terms used with respect to the substrate. Therefore, turning the substrate on its side will not change the fact that the memory array 102 is still above the substrate because the use of the term "above" is with respect to the surface of the substrate and not with respect to the orientation of the substrate. The support circuitry includes column control circuitry 110, row control circuitry 120 and system control logic 130. Note that FIG. 5 shows metal layers R1 and R2 to be wider than the memory array 102 to accommodate support circuitry that is on the surface of the Substrate but not underneath memory array 102.

Memory array 102 is subdivided into bays, and each bay can (optionally) be divided into a number of blocks. The number of bays can be different for different implementations. In one embodiment, there are 16 blocks in a bay. However, other embodiments can use different numbers of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

Figure 7:
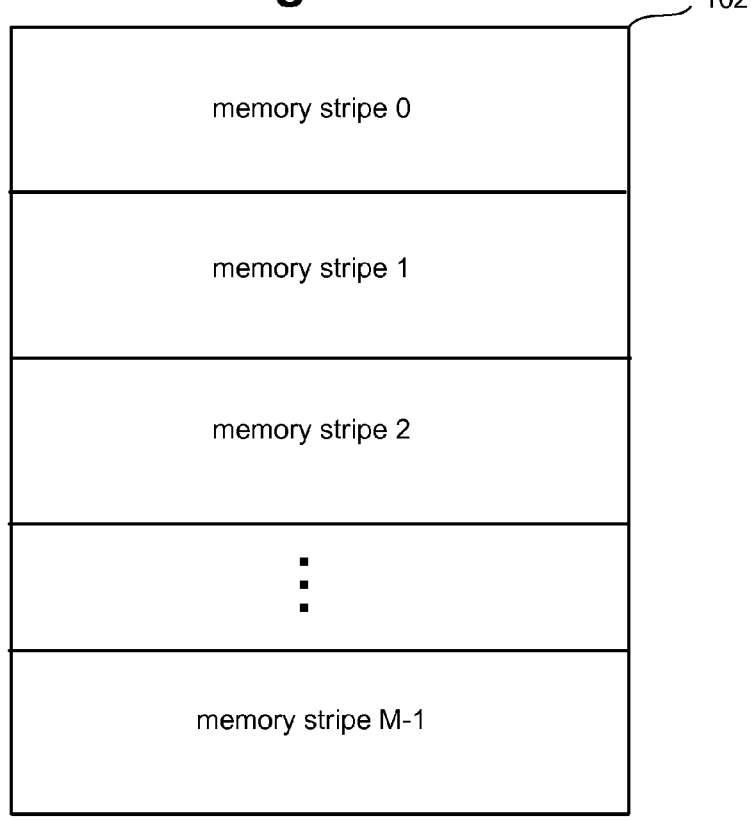
FIG. 7 is as block diagram depicting one example of an organization of a memory array.

In one embodiment, memory array 102 is arranged into stripes (e.g., 16 stripes). A stripe is a linear grouping of blocks of memory elements from one end of the array to the other end. A stripe may have one bay, more than one bay or less than one bay. In one embodiment, a bay includes two stripes, and each stripe includes 32 blocks. Therefore, a bay includes 64 blocks. FIG. 7 is a block diagram depicting the organization of one example memory array 102, which is arranged above substrate 300 and includes M stripes.

Figure 8:
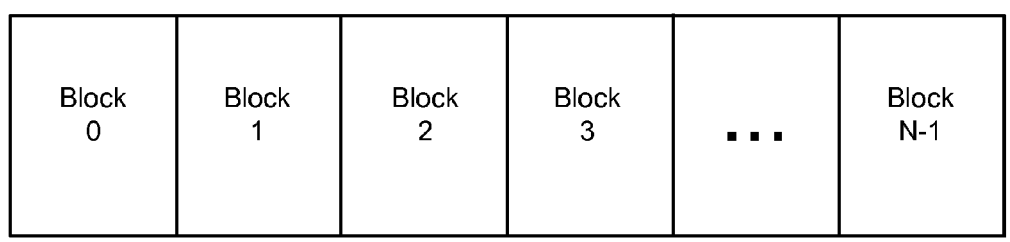
FIG. 8 is a block diagram depicting one example of an organization of a memory stripe.

FIG. 8 depicts one example of a stripe. As can be seen, the blocks are only arranged from one end to the other. FIG. 8 shows a stripe having N blocks. The exact number of blocks in a stripe is dependent on the particular implementation, and no specific number of blocks in a stripe is required for the technology described herein.

Figure 9:
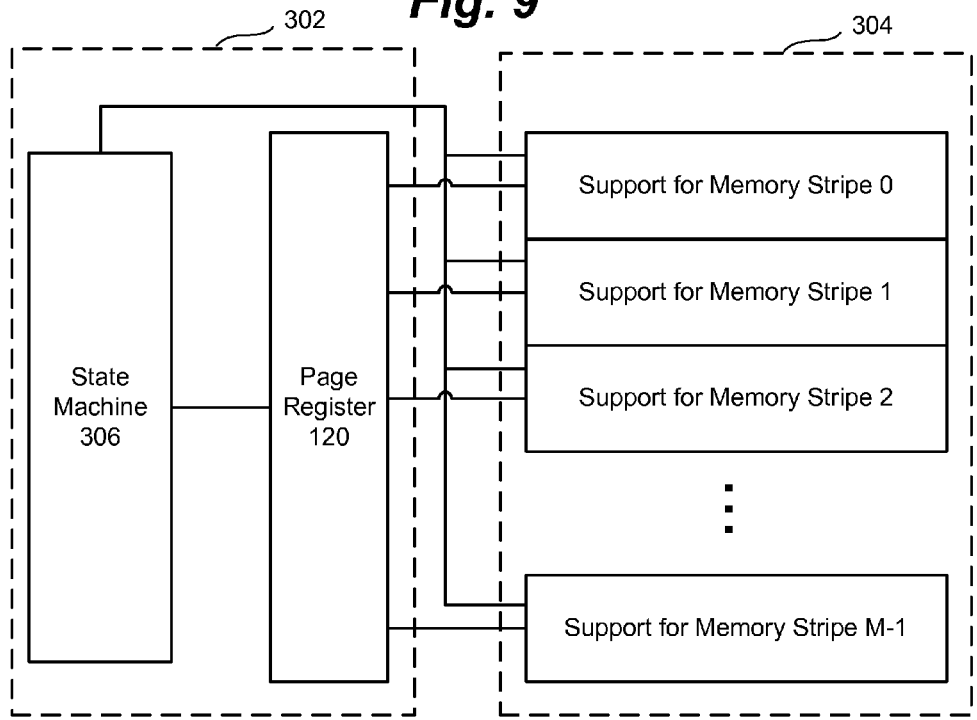
FIG. 9 is a block diagram of one embodiment of support circuitry for a memory array.

Looking back at FIG. 6, the support circuitry from memory array 102 can include column control circuitry 110, row control circuitry 120 and system control logic 130. In one embodiment, controller 134 is implemented on a separate substrate. However, in other embodiments, controller 134 can be implemented on the same substrate as the memory array. As explained above with respect to FIG. 6, some of the support circuitry will be fabricated on the surface of the substrate 300 below memory array 102 and other portions of the support circuitry will be implemented on the surface of substrate 300 outside memory array 102. FIG. 9 is a block diagram depicting an example of support circuitry implemented underneath memory array 102 and outside memory array 102. For example, FIG. 9 shows support circuitry 302 which is arranged on the surface of substrate 300 in an area that is not underneath the monolithic three-dimensional memory array 102. FIG. 9 shows support circuitry 304 which is arranged on the surface of substrate 300 underneath memory array 102. In some embodiments, some portions of the support circuitry can also be implemented on various levels of the three-dimensional memory array 102.

Support circuitry 302 of FIG. 9 includes (at least) page register 120 and state machine 306 (part of system control logic 130). Other portions of the support circuitry can also be included in support circuitry 302. In one embodiment, a logical page of data is the minimum unit of data used for programming. Thus, memory is programmed and read in sets of pages. Page register 102 will include a register that can store a logical page of data for reading and writing. A page is typically implemented across multiple blocks. In one embodiment, a page includes 2048 bytes of data and 128 bytes of header information (e.g., including ECC) for a total of 2176 bytes. Page register 120 will also include logic circuits to manipulate the data before writing (e.g., data encoding) and for verifying whether data read after a write process matches the data intended to be written (e.g., verify operation). The page register serves as an intermediate storage device with respect to the host and the memory array.

State system control logic 130 (see FIG. 1) will include state machine 306, circuitry for providing various voltages, and other control circuitry. State machine 306 is used to control the reading and writing of data. FIG. 9 shows state machine 306 in communication with page register 120.

Control circuitry 304 implemented on the surface of substrate 300 underneath memory array 102 is divided into sets of circuits corresponding to various memory stripes. Each memory stripe, therefore, has a set of circuits below the memory stripe that provides support for that memory stripe. For example, Support for Memory Stripe 0 includes support circuits for memory stripe 0. Note that a memory stripe will have multiple levels in a monolithic three-dimensional memory array. Below memory stripe 0 of memory array 102 is Support for Memory Stripe 0, below memory stripe 1 is Support for Memory Stripe 1, below memory stripe 2 is Support for Memory Stripe 2, . . . , below memory stripe M-1 is Support for Memory Stripe M-1. State machine 306 is in communication with Support for Memory Stripe 0, Support for Memory Stripe 1, Support for Memory Stripe 2, . . . , Support for Memory Stripe M-1. Page register 102 is also in communication for Support for Memory Stripe 0, Support for Memory Stripe 1, Support for Memory Stripe 2, . . . , Support for Memory Stripe M-1.

Figure 10:
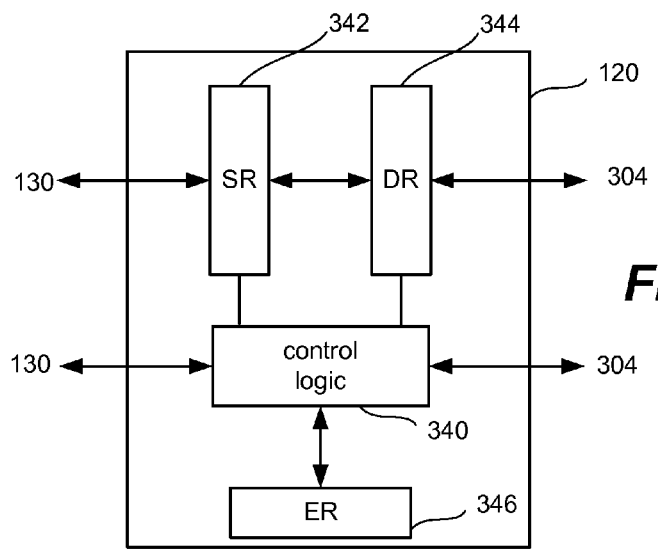
FIG. 10 is a block diagram of one embodiment of a page register.

FIG. 10 is a block diagram of page register 120. In one embodiment, page register 120 includes control logic 340, which can include a circuit (digital and/or analog circuits) used to control page register 120. Control logic 340 is in communication with shadow register 342, data register 344 and error register 346. Control logic 340 is in communication with various support circuitry 304 as well as system control logic 130 (including state machine 306). Shadow register 342 receives data and provides data to system control logic 130. In other embodiments, data to/from shadow register 342 can be provided to/from controller 134 or directly to the host. Data register 344 receives data from and provides data to support circuitry 304. In one embodiment, shadow register 342, data register 344 and error register 346 are the same size as a page of data. Therefore, if the page of data includes 2048 bytes of data and 128 bytes of header, then shadow register 342, data register 344 and error register 346 can store 2176 bytes.

Data received by page register 120 is input into shadow register 342. Control logic 340 may process that data to perform various data encoding, add ECC (error correction codes), or other functions. The data is then transferred from shadow register 342 to data register 344. Note, for the purposes of this document the term "transfer" includes providing a copy from the source to the destination and may include leaving a copy at the source or removing the copy from the source. From data register 344, the data can be transferred to the support circuitry 304 for the appropriate memory stripe for programming into memory array 102. Data read from memory array 102 is provided from the appropriate support circuitry 304 for the appropriate memory stripe to data register 344. Data in the data register 344 can then be transferred to shadow register 342 where various decoding, ECC and verification processes can be performed. The final data is transferred from shadow register 342 to system control logic 130, controller 134 and/or the host. Control logic 340 uses error register 346 for any one of various functions including determining ECC errors (in some embodiments), determining write verification errors, and/or other functions. ECC can also be determined in the controller.

Figure 11:
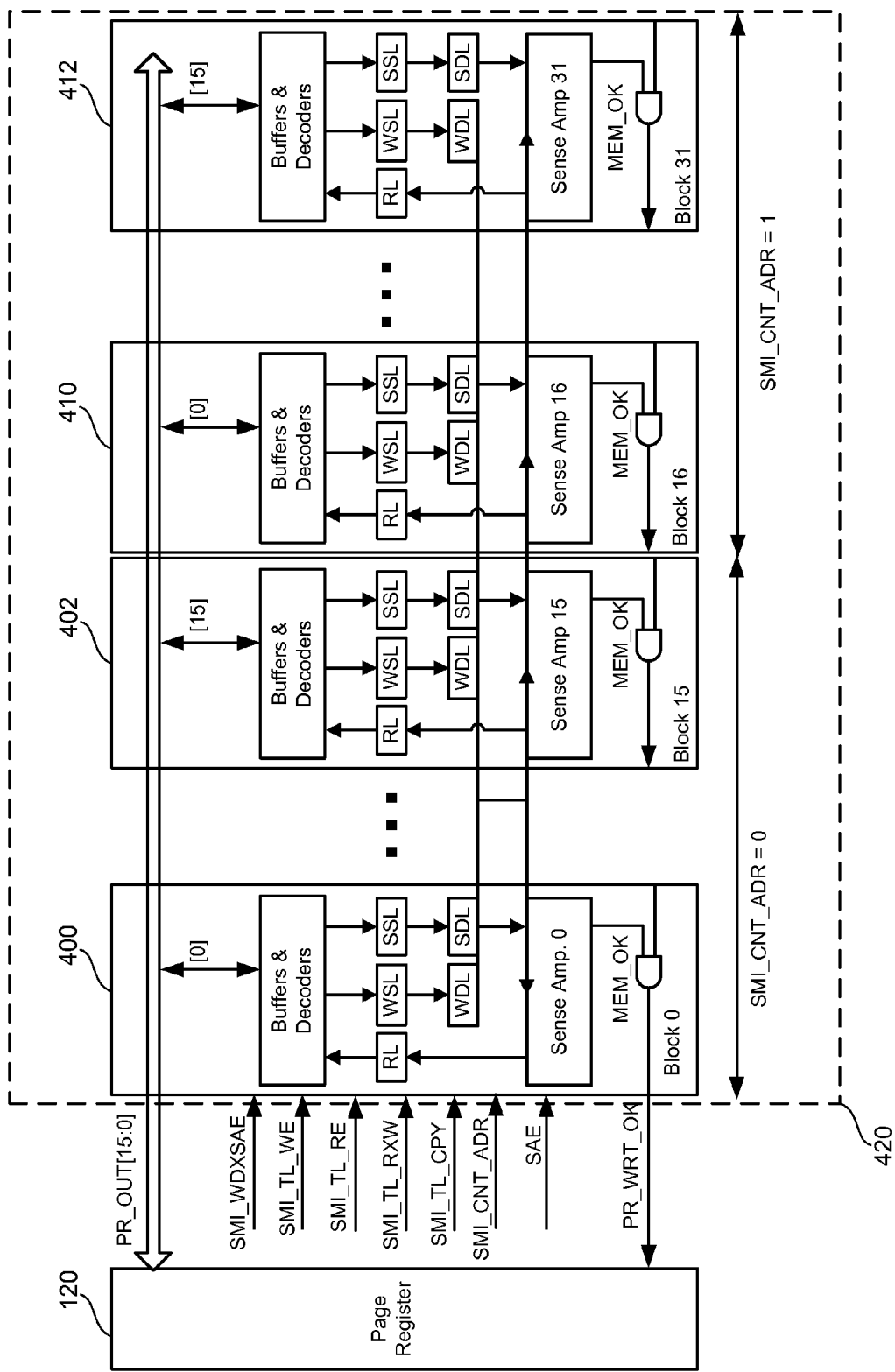
FIG. 11 is a block diagram of one embodiment of support circuitry for a memory stripe.

FIG. 11 is a block diagram showing page register 120 and support circuitry 420 for one memory stripe. Support circuitry 420 is a subset of circuitry 304. For example, support circuitry may represent any one of Support for Memory Stripe 0, Support for Memory Stripe 1, Support for Memory Stripe 2, . . . , Support for Memory Stripe M-1 depicted in FIG. 9. In one embodiment, the support circuitry for a memory stripe is divided up into groupings of support circuitry, with each block including its own grouping. For example, FIG. 11 identifies 32 groupings of circuits, with each grouping being associated with one of the blocks (e.g., block 0, . . . block 31). For example, grouping of support circuits 400 is associated with block 0 and is implemented on the surface of substrate 300 below block 0. Grouping of support circuits 402 is associated with block 15 and is implemented on the surface of substrate 300 below block 15. Grouping of support circuits 410 is associated with block 16 and is implemented on the surface of substrate 300 below block 16. Grouping of support circuits 412 is associated with block 31 and is implemented on the surface of substrate 300 below block 31. Although the architecture of FIG. 11 includes 32 blocks and therefore 32 groupings of support circuits, only four groupings of support circuits are depicted in FIG. 11 due to space constraints on the page. However the " . . . " is used to indicate the 14 groupings of support circuits not depicted.

FIG. 11 shows a bi-directional data bus PR_OUT [15:0] which connects to page register 120 and runs across the entire stripe so that each grouping of support circuits (400 . . . 402, 410 . . . 412) is connected to one bit of the 16 bit bus PR_OUT [15:0]. In other embodiments, the bus can be wider than 16 bits or narrower than 16 bits. Each grouping of support circuits (400 . . . 402, 410 . . . 412) includes a set of Buffers & Decoders connected to one bit of the bus PR_OUT [15:0]. For example, the grouping of support circuits 400 associated with block 0 is connected to PR_OUT [0], the grouping of support circuits associated with block 1 is connected to PR_OUT [1], the grouping of support circuits associated with block 2 is connected to PR_OUT [2], . . . , and the grouping of support circuits 402 associated with block 15 is connected to PR_OUT [15]. Additionally, the grouping of support circuits 410 associated with block 16 is connected to PR_OUT [0], the grouping of support circuits associated with block 17 is connected to PR_OUT [1], the grouping of support circuits associated with block 18 is connected to PR_OUT [2], . . . , and the grouping of support circuits 412 associated with block 31 is connected to PR_OUT [15].

Each grouping of support circuits (e.g., group 400) also includes a set of five latches. Instead of latches, other storage devices can also be used (e.g., flip-flops). These five latches include a Read Latch RL, W-Data Shadow Latch WSL, W-Data Data Latch, Sense Amp Enable Shadow Latch SSL and Sense Amp Enable Data Latch SDL. The Read Latch RL is used to store read data that was read from the memory array. Write data to be stored in the memory array is first stored in the W-Data Shadow Latch WSL, then stored in the W-Data Data Latch WDL, and then written into memory array 102. The page register sends sSense Amp Enable information to the sense amplifier (discussed below). The Sense Amp Enable information is first stored in the Sense Amp Enable Shadow Latch SSL, then stored in the Shadow Data Latch SDL and then used by the sense amplifier as part of the programming process.

To accomplish the above functionality, the Buffer & Decoders are connected to the Read Latch RL for receiving data from the Read Latch RL. The Buffer & Decoders are connected to the W-Data Shadow Latch WSL to provide write data to the W-Data Shadow Latch WSL, and to the Sense Amp Enable Shadow Latch SSL to send Sense Amp Enable information to the Sense Amp Enable Shadow Latch SSL. The W-Data Shadow Latch WSL is connected to the W-Data Data Latch. The Sense Amp Enable Shadow Latch is connected to the Sense Amp Enable Data Latch. The W-Data Data Latch WDL and the Shadow Data Latch SDL are both connected to and send information to the appropriate sense amplifier.

The sense amplifier sends its read output to the Read Latch RL. The sense amplifier that is part of grouping of support circuits 400 and located under block 0 is referred to as Sense Amp 0 because of the association with block 0, the sense amplifier that is part of grouping of support circuits 402 is referred to as Sense Amp 15 because it is below block 15 and associated with the support circuitry for block 15, etc. Each of the groupings of support circuits (400 . . . 401, 410 . . . 412) includes an associated sense amplifier. The sense amplifiers are used to apply the appropriate signals to the bit lines in order to program the bit lines and to sense conditions of the bit lines during a read process in order to determine the read data stored by the associated memory cells connected to the bit lines. Each sense amplifier is depicted with an output which indicates that a memory operation was successfully performed (MEM_OK). These signals are daisy-chained by a set of AND gates so that if all the sense amplifiers output that the memory operation was successful the signal PR_WRT_OK will be at a logic 1. That signal is sent to page register 120 to indicate a successful memory operation.

As discussed above, the data bus PR_OUT [15:0] is a 16-bit data bus; however, there are 32 groupings of support circuits and 32 sense amplifiers. Therefore multiple sense amplifiers (and the associated grouping of support circuits) must share bits of the data bus PR_OUT [15:0]. As discussed above, the grouping of support circuits 400 for block 0 and the grouping of support circuits 410 for block 16 share bit PR_OUT[0], the grouping of support circuits for block 2 and the grouping of support circuits for block 17 share bit PR_OUT[1], . . . , the grouping of support circuits 402 for block 15 and the grouping of support circuits 412 for block 31 share bit PR_OUT[15]. The memory system uses a signal SMI_CNT_ADR to indicate which of the two blocks sharing a bit on the data bus is communicating on the bus. If SMI_CNT_ADR equals 0, then blocks 0-15 are communicating on the bus PR_OUT [15:0]. If the signal SMI_CNT_ADR=1, then block 16-31 are communicating on data bus PR_OUT [15:0]. Note that the number of blocks used can change for various implementations of various embodiments. Therefore, if there were more than 32 blocks, then the signal SMI_CNT_ADR may need to be more than 1 bit. For example, if there were 64 blocks in a stripe, then the signal SMI_CNT_ADR would have 2 bits to indicate which of the 4 subsets of sense amplifiers will be connected to the data bus. Similarly, if there 256 blocks in a stripe, then the signal SMI_CNT_ADR would need to be 4 bits wide to indicate which of the 16 subsets of sense amplifiers would be connected to the data bus.

FIG. 11 also shows a set of signals transferred to the support circuitry 420 for the stripe from the state machine. These signals include SMI_WDXSAE, SMI_TL_WE, SMI_TL_RE, SMI_TL_RXW, SMI_TL_CPY, and SAE. The signal SMI_WDXSAE determines whether the bus PR_OUT [15:0] is being used to transfer data or or Sense Amp enable information. Data to be programmed that is transferred on the bus PR_OUT[15:0] is destined for the W-Data Shadow Latch WSL and the Sense Amp Enable information communicated on the bus PR_OUT[15:0] is destined for the Sense Amp Enable Shadow Latch SSL. Because the same bit on the bus is used to transfer both the write data and the Sense Amp Enable information, the signal SMI_WDXSAE (from the state machine) is used to indicate which function the bus PR_OUT [15:0] is currently being used for.

The signal SMI_TL_RXW is used to indicate whether the data bus PR_OUT[15:0] is being used to send read data from the support circuitry to page register 120 or to send write data from page register 120 to the appropriate support circuitry. The signal SMI_TL_WE is used as the latch enable signal for the W-Data Shadow Latch WSL and the Sense Amp Enable Shadow Latch SSL for all of the groupings 400 . . . 401 and 410 . . . 412 for the particular stripe. The signal SMI_TL RE is the latch enable signal for the Read Latches RL for the entire stripe. The signal SMI_TL_CPY is copy signal for copying the data from Write-Data Shadow Latch WSL and the SenseAmp-Enable Data Latch SDL to Write-Data Data Latch WDL and the SenseAmp-Enable Data Latch SDL respectively. The signal SAE is a sense amp enable signal indicating to all of the sense amplifiers for the strip to program the data from the W-Data Data Latches into the appropriate memory cells of the monolithic three-dimensional memory array 102.

Figure 12:
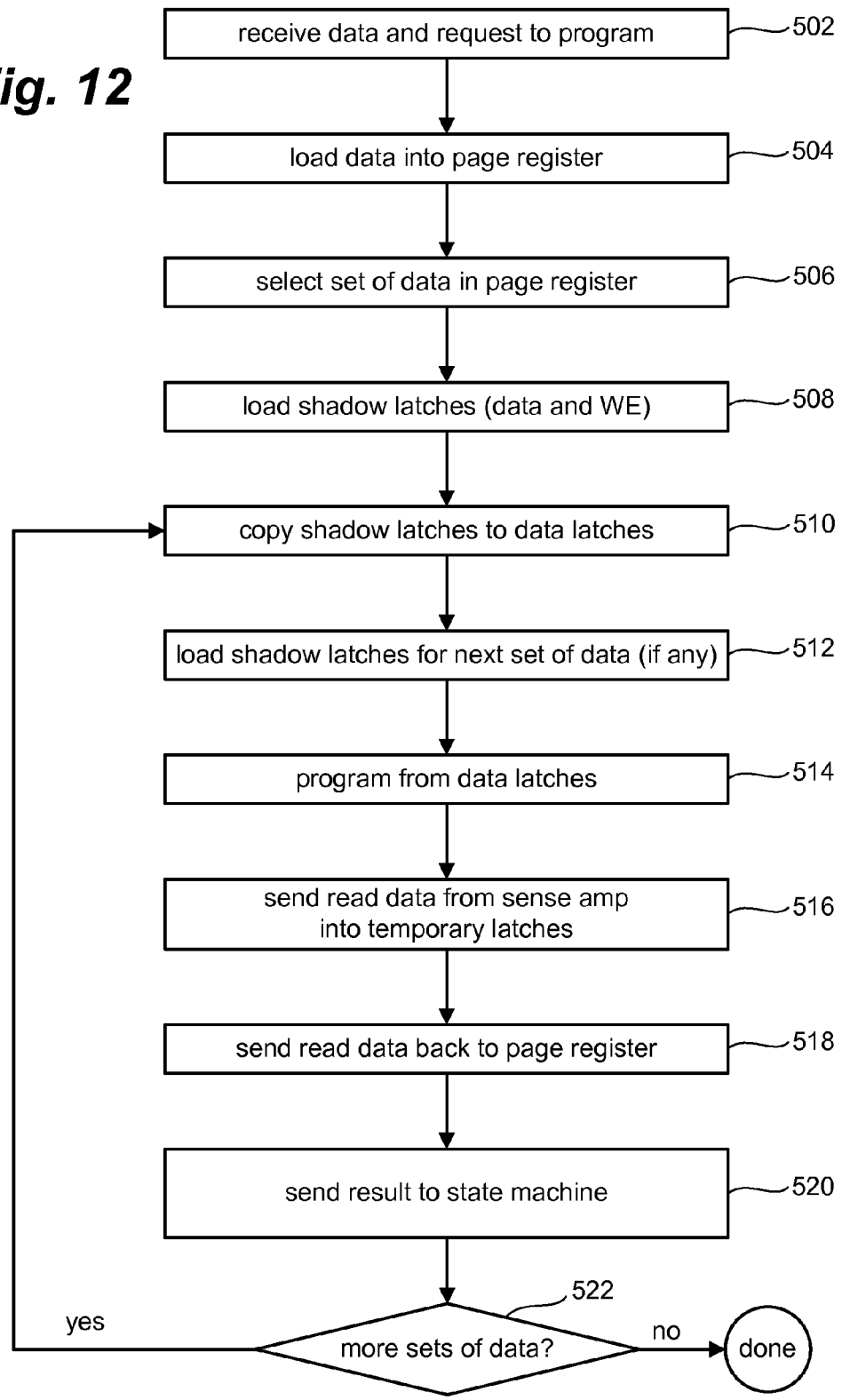
FIG. 12 is a flow chart describing one embodiment of a process for programming data.

FIG. 12 is a flow chart describing one embodiment of a process for programming using the components of FIGS. 1-11. Other embodiments of programming process can also be used to program data using those components. In step 502 of FIG. 12, the system will receive data and a request to program that data into the memory array 102. For example, the host will issue a command to controller 134 to program data and provide that data. That data will be first received by the host, and then transferred to system control logic 130. In another embodiment, system control logic 130 or controller 134 can determine that data needs to be programmed and present that data as necessary. For example, controller 134 may request data to be programmed as part of a garbage collection process, memory reorganization process, etc. In step 504, the data to be programmed is loaded into page register 120. For example, the data is loaded into shadow register 342 of page register 120 from system control logic 130, controller 134, or directly from the host. As discussed above, in one example, each stripe includes a data bus PR_OUT[15:0]. In the example where there are 16 stripes, 256 bits of data can be sent to support circuitry at the same time (assuming that each stripe has its own data bus PR_OUT). If the page register holds 2176 bytes of data and only 256 bits can be transferred out at a time, then the state machine 306 must determine which 256 bits to be selected for output on the 16 data buses. In the example mentioned above, there are sixteen data buses PR_OUT[15:0]—one for each of the sixteen stripes. Step 506 of FIG. 12 includes the state machine selecting which set of data in the page register to output on each of the data buses PR_OUT[15:0].

In one embodiment, the various memory cells in memory array 102 are arranged in columns There are multiple columns in each block. For example, one block may include 64 columns. If a stripe includes 32 blocks, then that stripe includes 32×64=2048 columns. As discussed above, there are only 32 sense amplifiers for a stripe (one under each block). Therefore, column decoder circuit 112 (see FIG. 1) is used to decode the column address and connect each sense amplifier to the appropriate column of memory cells in step 506. In one example, the system will only read from or write to one block at a time.

Once the selection of the set of data from the page registered is performed in step 506, that data is output on each bidirectional data bus PR_OUT [15:0]. In step 508, the W-Data Shadow Latches WSL latch the data from the bus. After sending the data on the data bus PR_OUT[15:0] for each stripe, the page register will then send Sense Amp Enable information on the data bus PR_OUT[15:0] for each stripe. The Sense Amp Enable information will be latched by the Status Shadows Latches SSL as part of step 508.

Even though the page register 120 may have data for all 32 sense amplifiers of a stripe, the page register or state machine may have decided that not all of the data should not be programmed into the memory array. In one example, if the data matches data already in the addresses memory cell, there is no point in overwriting that data. In another embodiment, the system may be re-writing only a subset of data that did not program properly the first time. There are other reasons for not wanting to write the data that may also apply. The Sense Amp Enable information transferred to the Status Shadows Latches SSL indicates to the associated sense amplifier whether to write the corresponding data transferred via the W-Data Shadow Latch WSL and the W-Data Data Latch WDL.

In step 510, the information stored in the shadow latches WSL and SSL for each of the groupings of support circuits are transferred from the shadow latches WSL and SSL to the data latches WDL and SDL. Note that the steps described above are performed for all the stripes concurrently. In step 512, the shadow latches WSL and SSL are loaded for the next set of data/information stored in the page register. In step 514, the data in the W-Data Data Latches WDL are programmed into the appropriately addressed memory cells using the appropriate sense amplifiers. The sense amplifiers will program the data from the W-Data Data Latches WDL if they receive the appropriate Sense Amp Enable information in their Sense Amp Enable Data Latches SDL. At the conclusion of the programming process, the sense amplifier will provide a copy of the data just written into the memory cell to the Read Latches RL in step 516. In one embodiment, sense amplifiers will actually perform a new read process to read that data. In another embodiment, the sense amplifiers will simply take the data that they received from the W-Data Data Latch and send it back to the Read Data Latch RL if the Write operation is successful (WRITE_OK=1) or invert and send it back to the RL if the write operation is not successful (WRITE_OK=0). In step 518, data in the Read Data Latches RL is sent back to page register 120 via the data bus PR_OUT [15:0] for each of the memory stripes. In step 520, page register 120 will send the results that were read back from the sense amplifier to state machine 306. If there is no more data that needs to be programmed (step 522) then the process of FIG. 12 is finished.

If there is more data to be programmed (this data will have already been loaded into the shadow latches in the previous iteration of step 512), then the process of FIG. 12 loops back to step 510 and copies the data from the shadow latches WSL and SSL into the data latches WDL and SDL. Following step 512, the next set of data is loaded into the shadow latches and the process of steps 510 to 522 is repeated until there is no more data to be programmed. Note that although the flow chart of FIG. 12 shows steps happening in consecutive order, many of the steps are actually performed concurrently. Additionally, other orders of the steps can also be used. For example, steps 512 and 514 can be performed concurrently, and steps 516 and 518 can be performed concurrently.

Figure 13:
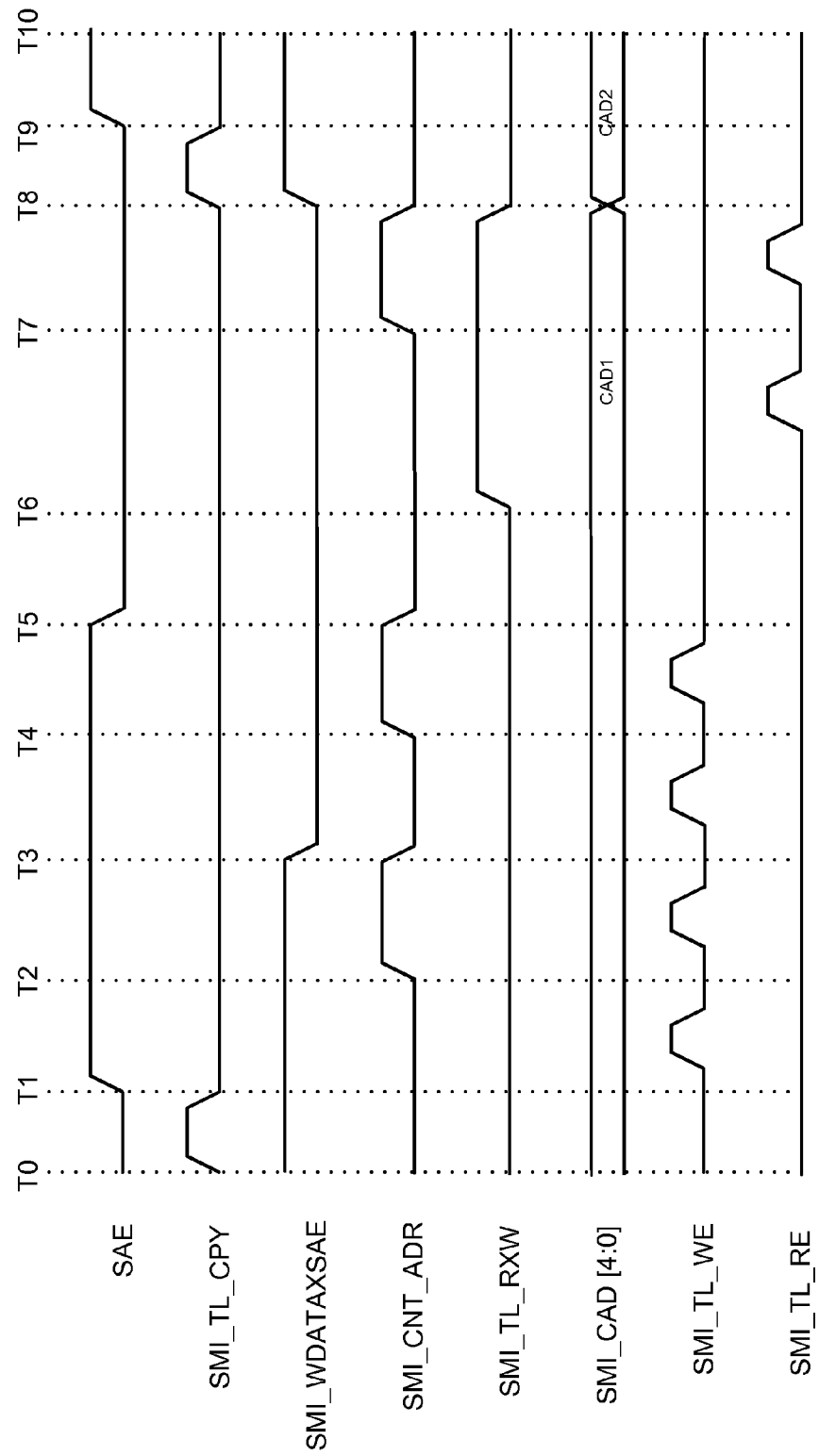
FIG. 13 is a timing diagram describing one embodiment of a process for programming data.

FIG. 13 is a timing diagram showing one iteration of performing steps 510-518. FIG. 13 shows the behavior of the signals SAE, SMI_TL_CPY, SMI WDATAXSAE, SMI_CNT_ADR, SMI_TL_RXW, SMI_CAD [4:0], SMI_TL_WE, and SMI_TL RE. Note that the signal SMI_CAD [4:0] is a signal from state machine 306 to page register 120 and other selection circuits indicating which column of memory cells is selected for programming. In one embodiment there are 32 columns in each block and the signal SMI_CAD [4:0] indicates which of those 32 columns is selected for programming. Between time T0 and T1, the signal SMI_TL_CPY is pulsed high and then remains low until time T8. This pulse is the latch enable signal for the W-Data Data Latch WDL and Sense Amp Enable Data Latch SDL which causes data from the shadow latches to be copied to the data latches WDL and SDL as part of step 510.

From time T1 to T5, the system loads the shadow latches for the next set of data (step 512) and concurrently programs the appropriately addressed memory cells from the W-Data Data Latches WDL (step 514). At time T1, SAE goes high to indicate to the state machines to start the programming process to program the data from the appropriate W-Data Data Latches WDL into the appropriately addressed memory cells in memory array 102. Between T1 and T2 the signal SMI_TL_WE is pulsed. During that pulse, SMI_WDXSAE is high indicating that write data is being transferred on the data bus PR_OUT[15:0] from page register 120 to the W-Data Shadow Latches WSL. The signal SMI_CNT_ADR is set low to indicate that the first subset of grouping of support circuits 400 . . . 402 are selected for connection to PR_OUT[15:0]. From T1 to T6 the signal SMI_TL_RXW is low so that the bus PR_OUT[15:0] is only being used for transferring write data and Sense Amp Enable information from page register 120 to the appropriate support circuitry 304. Between times T2 and T3, the signal SMI_TL_WE is pulsed again, this time with SMI_CNT_ADR set to logic 1 so that the W-Data Data Latches WDL for the second grouping of support circuits 410 . . . 412 will receive write data for programming.

Between times T3 and T4, SMI_TL_WE will receive another pulse to cause the Sense Amp Enable Shadow Latches to latch Sense Amp Enable information transmitted on PR_OUT[15:0] from page register 120. Between times T3 and T4, SMI_CNT_ADR is set to low to indicate the Sense Amp Enable Shadow Latches for the first grouping of support circuits 400 . . . 402 receive the Sense Amp Enable information and SMI_WDATAX SAE is set to low to indicate that Sense Amp Enable information is being transmitted on the data bus PR_OUT[15:0]. Between times T4 and T5, SMI_TL_WE receives another pulse in order to latch Sense Amp Enable information at Sense Amp Enable Shadow Latches for the second grouping of support circuits 410 . . . 412 from the page register 120 via data bus PR_OUT[15:0]. Between times T4 and T5, SMI_CNT_ADR is set high to indicate that the data is latched in the Sense Amp Enable Shadow Latches for the second grouping of support circuits 410 . . . 412. The signal SMI_WDXSAE is set low to indicate that Sense Amp Enable data is being transmitted on PR_OUT [15:0].

At T5, SAE goes low indicating that the write process has finished writing the data into the appropriate memory cells. In response to SAE transitioning to low, the appropriate sense amplifiers will read back the data to the Read Latches RL. Therefore, the data bus PR_OUT will now be used to transmit data from the support circuitry 304 back to the page register 120 and the signal SMI_TL_RXW goes to logic 1 at T6 and stays high until time T8 to. The time period between time T6 and T8 is used to perform step 516 of FIG. 12. Simultaneously while performing 516, the system will perform step 518 of Figure, which includes sending the read data back to page register 120. In order to perform step 516, the signal SMI_TL_RE is pulsed twice, once between times T6 and T7 and a second time between times T7 and T8. For the first pulse, SMI_CNT_ADR is set low and for the second pulse SMI_CNT_ADR is set high. This way, the first pulse will cause data to be loaded into the read latches RL for the first groupings of support circuits 400 . . . 402 and the second pulse of will cause data to be loaded into the read latches RL for the second groupings of support circuits 410 . . . 412. As soon as SMI_TL_RE goes high, the respective data is loaded in to the latches RL and made available on PR_OUT[15:0] for transfer to page register 120.

At T8, the process of performing steps 510 to 518 has completed. Starting a T8, the next iteration of steps 510 to 518 will be performed. Therefore, at time T8, SMI_TL_CPY receives another pulse to transfer the data from the shadow latches to the data latches and the process will continue. Additionally, at time T8, the column address SMI_CAD [4:0] will change to the next column.

As explained above, the memory cells in memory array 102 are arranged in columns such that each block has its own set of columns. For example, each block may have 32 columns of memory cells. Each column of memory cells can have 16, 32, 64 or another number of memory cells in the column. A single page of data will span multiple columns. There are many instances when programming a particular page of data that is not necessary for the memory system to program certain columns of memory cells. For example, if the amount of data in the page register is less than a page, then some of the memory cells addressed by the page need not be programmed. For example, if the page register is only storing 80% of a page of data, 20% of the memory cells need not be programmed. The first 80% of the bits of the page are used for user data and the last 20% of the bits do not have user data. In another example, it is possible that some of the data received for programming already matches data in the memory cells. In such a case, those memory cells that store data which matches the data to be programmed need not be programmed.

It is possible that a sequential series of bits of the data to be programmed match the data stored in an entire column of memory cells. In that case, the entire column of memory cells need not be programmed. For example, in an image file, it is possible that vast portions of the image are white and it is possible that the data for white may already be stored in the memory cells. In another example, the memory system will read back an entire page after programming and verify that the page read back matches the data that was supposed to be programmed. If not all of the data matches (or less than a predetermined number of bits match), then the page will be reprogrammed. When reprogramming the page, it is possible that many columns of memory cells can be skipped because their data does match the data to be programmed. By skipping the programming of one or more columns of memory cells, the programming process will be completed faster and with less power.

Some prior systems provide the ability to skip a programming of a column of memory cells. In those prior systems, while programming data into a first column of memory cells, the system will evaluate whether it should skip a second column of memory cells. If the system determines that it should not skip the second column of memory cells then when the first column of memory cells has completed programming, the second column of memory cells will be programmed. If the system determined that it should skip programming of the second column of memory cells, then the system will wait until the first column of memory cells has completed. After the first column of memory cells has completed, the system will then evaluate whether it should skip the third column of memory cells. If it should not skip the third column of memory cells, then the third column of memory cells will then be programmed. This process will continue. One disadvantage of this process is that once it is determined that the system should skip a column of memory cells, the system remains idle until the current column of memory cells have completed programming. Therefore, a process is proposed that enables the memory system to evaluate and decide to skip multiple columns of memory cells while programming a prior column of memory cells. This process is described in the flow chart of FIG. 14.

Figure 14:
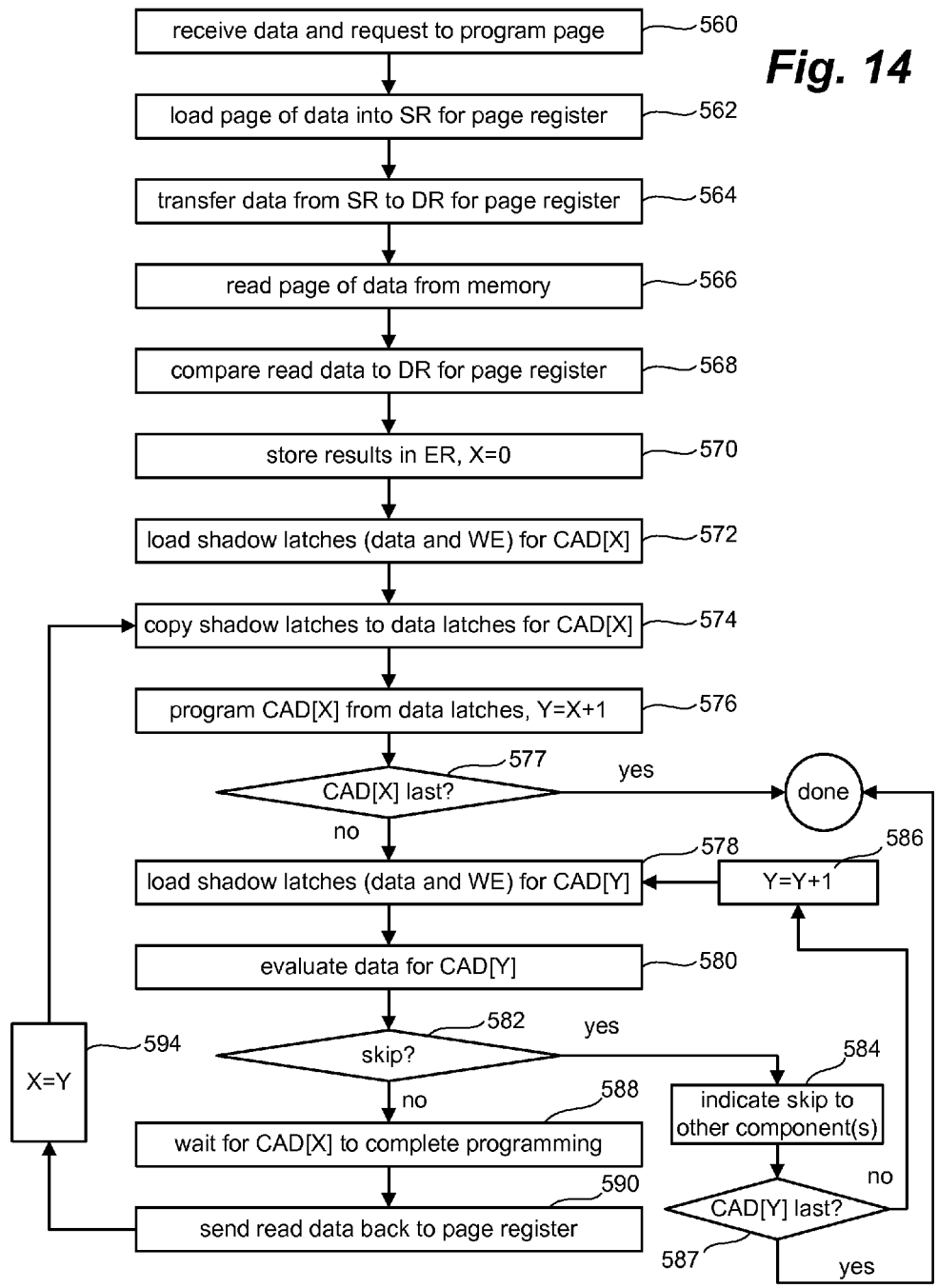
FIG. 14 is a flow chart describing one embodiment of a process for programming data that includes skipping cycles.

In step 560 of FIG. 14, a page (or more) of data and a request to program the page of data is received. For example, the data and the request can be received at controller 132 from the host. Alternatively, the data and request can be received at system control logic 130 (including state machine 306.) In step 562, the page of data is loaded into shadow register 342 of page register 120. In step 564, the data in the shadow register 342 is transferred to data register 344 of page register 120.

In step 566, the system will read the memory cells that are targeted for storing the page of data currently residing in data register 344. Note that both the programming process and read processes are performed at the direction of state machine 306, which is part of system control logic 130. The page of data is read back from the target memory cells and streamed to control logic 340 of page register 120. As each bit is received by control logic 304, it is compared to the corresponding bit in data register 344. If the two bits match, a zero will be stored in a corresponding bit in error register 346. If the two bits do not match, then the corresponding bit in error register 346 stores a logic one. When all the data read from the memory cells has completed being streamed to control logic 304, error register 346 will store the set of results for the comparison between the data to be programmed and the data already residing in the memory cells (step 570). Those bits that match do not need to be reprogrammed. Those bits of data that do not match what is in the memory cells need to be programmed. The error register will then be used as the source of the Sense Amp Enable information that will be loaded into the appropriate Sense Amp Enable Shadow Latches SSL to turn on programming for individual bits. Step 570 also includes initializing the column counter X to be zero.

In step 572, the shadow latches (WSL and SSL) will be loaded for the first set of data for each stripe for CAD[X], which the column addressed by X (e.g., column 0). In the example above, 16 bits of the Sense Amp Enable (SSL) and 16 bits of data (WSL) are transferred simultaneously for each stripe as part of step 572. In one embodiment, four cycles are needed: (1) transfer 16 bits of write data, (2) transfer 16 bits of write data, (3) transfer 16 bits of Sense Amp Enable information, and (4) transfer 16 bits of Sense Amp Enable information. In other embodiments that have different numbers of sense amplifiers and a different bus width, the cycles may be different.

In step 574, data in the shadow latches (WSL and SSL) for all the stripes are copied to the data latches (WDL and SDL). In step 576, data for the particular column that is currently addressed is programmed from the WDL latches into the appropriate memory cells. In addition, variable Y is set to the value of the variable X plus 1. The use of this variable will be explained later. If CAD[X] is the last column to be programmed (step 577), then the process is complete. Otherwise, in step 578, the shadow latches WSL and SSL are loaded with the write data and Sense Amp Enable data for the next column (addresses by CAD[Y]). Remember, in step 572, column CAD[X] was the addressed column and that column was programmed in the previous iteration of step 576. The variable Y is set to equal one more than X (If X is not the last column) so that at this point in time CAD[Y] addresses the next column after CAD[X]. The Sense Amp Enable information loaded into the shadow latches is from error register 346. In step 580, page register 120 will evaluate the write data for the next column CAD[Y] to see if that data needs to be programmed. In the example where column CAD[0] is the current column being programmed, the next column is column CAD[1]. Steps 578 and 580 can be performed in parallel or one after the other (in either order). In one embodiment, page register 120 evaluates whether to skip the next column by looking at the bits in error register 346. If all the corresponding bits for the column are set at zero, then no data needs to be programmed into that column and page register 120 will conclude that that column can be skipped.

If it is determined that the next column can be skipped (step 582), then in step 584 page register 120 will indicate to other components (including state machine 306) that the next column should be skipped. In some embodiments, the transfer of data to the shadow latches (step 578) could then be aborted since it is no longer necessary. It is possible that the transfer will have already been completed. If CAD[Y] is the last column to be programmed (step 585), then the process is complete. Otherwise, in step 586, variable Y is incremented and the process loops back to step 578. In the next iteration of step 578, the shadow latches are loaded for the data and Sense Amp Enable for subsequent column CAD[Y], and the process continues as discussed above. The loop of steps 578, 580, 582, 584 and 586 will be repeated until it is determined not to skip a column. As can be seen, when page register 120 determines that a column should be skipped, page register 120 does not wait for the currently addressed column to finish programming before evaluating the next column. Thus, while the current page of data is being programmed and without waiting for the current page to complete programming, page register 120 can evaluate multiple columns until it finds a column to program.

If page register 120 determines that it should not skip a column (step 582), then in step 588 page register 120 and state machine 306 will wait for the current column (e.g., CAD[X]) to complete programming. After the current column CAD[X] completes programming, the page of data written for the current column CAD[X] will be read back to page register 120 in step 590. In step 592, state machine 306 will determine whether there are more sets of data to program. If not, the process of FIG. 14 is complete. If there is more data to program, then the variable X is set to equal Y and the process loops back to step 574 to continue as discussed above.

Figure 15:
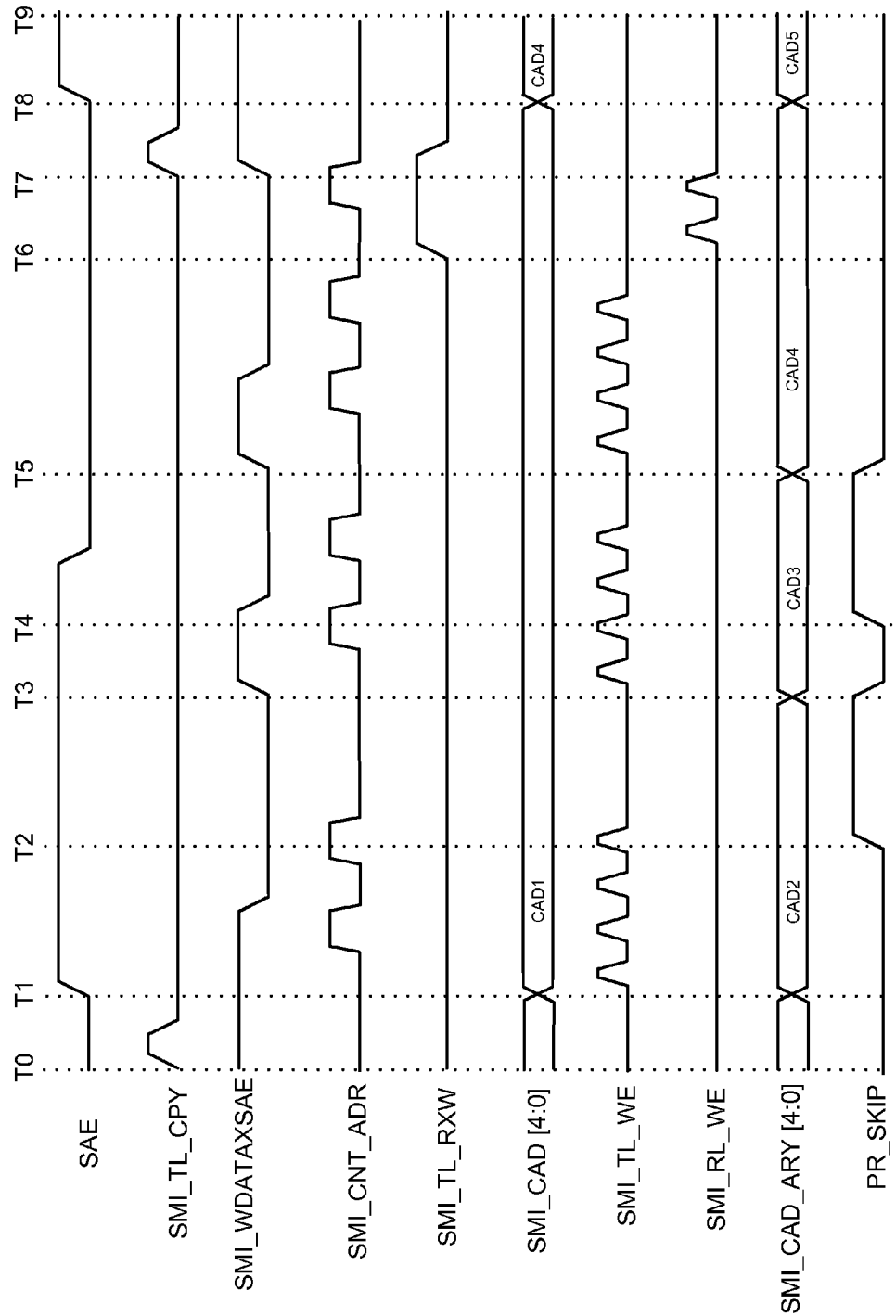
FIG. 15 is a timing diagram describing one embodiment of a process for programming data that includes skipping cycles.

FIG. 15 is a timing diagram which shows the behavior of various signals during three iterations of steps 574-582. The signals depicted in FIG. 15 include SAE, SMI_TL_CPY, SMI_WDXSAE, SMI_CNT_ADR, SMI_TL_RXW, SMI_CAD [4:0], SMI_TL WE, SMI_TL_RE, SMI_CAD ARY [4:0] and PR_SKIP. The signal PR_SKIP indicates that page register 120 determined that programming for the next column should be skipped (see step 584 of FIG. 14). The signal SMI_CAD [4:0] indicates the current column being programmed. The signal SMI_CAD ARY [4:0] indicates the column that is currently being evaluated for skipping. Thus, SMI_CAD [4:0] is analogous to CAD [X] of FIG. 14 and SMI_CAD ARY [4:0] is analogous to CAD [Y] of FIG. 14.

At time T0 of FIG. 15, the signal SMI_TL_CPY is pulsed. This corresponds to step 574 because SMI_TL_CPY is the latch enable signal for WDL and SDL to copy in the data from WSL and SSL. At T1, SMI_CAD [4:0] changes to show a new column address (e.g., CAD1) for data to be programmed. The change in the column address is analogous to step 594 of FIG. 14. Also at T1, SAE is set high to start the programming progress for CAD[X] (in this case CAD [1]). SAE will stay high until a point between T4 and T5. Also at T1, SMI_CAD ARY [4:0] changes to indicate the next column to be evaluated, which in this example is CAD2. The changing of SMI_CAD ARY [4:0] corresponds to settling the value Y to be equal to "X+1" in step 576.

Shortly after time T1, the shadow latches WSL and SSL are loaded for the column addressed by SMI_CAD ARY [4:0] (analogous to CAD [Y]). Thus, after time T1, the signal SMI_TL_WE is pulsed four times. During all four pulses, the signal SMI_TL_RXW is set low to indicate that write data is being transferred on the bus PR_OUT. During the first and third pulses of SMI_TL_WE, the signal SMI_CNT_ADR is set low to indicate groups of support circuits 400 . . . 402. On the second and fourth pulses of SMI_TL_WE, the signal SMI_CNT_ADR is high to select groups of support circuits 410 . . . 412. During the first two pulses of SMI_TL_WE, SMI_WDXSAE is high indicating that write data is being transferred on PR_OUT. During the second two pulses of SMI_TL_WE, the signal SMI WDATAXSAE is set low to indicate that Sense Amp Enable information is being transferred on PR_OUT from the page register 120 to Sense Amp Enable Shadow Latches SSL. During the four pulses, page register is, in parallel, evaluating the data in error register 346 to determine whether column CAD2 should be skipped. In this example, page register 120 determines that the data to be programmed into CAD2 is the same data that is already in CAD2; therefore, the programming of CAD2 can be skipped. Therefore, at time T2 page register 120 will set PR_SKIP to be high in order to indicate that the next column (CAD2) should be skipped. PR_SKIP is sent to state machine 306. Setting PR_SKIP high corresponds to step 584 of FIG. 14. Note that the evaluation of step 580 occurs between T1 and T2.

At time T3, SMI_CAD_ARY [4:0] is changed to indicate the next column to be evaluated. This changing of the column address is analogous to incrementing the variable Y in step 586 of FIG. 14. In response to incrementing the column address, the shadow latches are again loaded with data for the new column, CAD3. As such, SMI_TL_WE is pulsed four times, corresponding to step 578. As discussed above, during the second and fourth pulse, SMI_CNT_ADR is set high and during the first and third pulse, SMI_CNT_ADR is set low. During the first two pulses, SMI_WDXSAE is high and during the second two pulses that signal is low. Between T3 and T5, page register 120 will evaluate the data for CAD3 to determine whether it needs to be programmed. In this example, page register 120 determines that the information in error register 346 indicates that the data to be programmed into CAD3 matches the data in CAD3 so the programming of CAD3 can be skipped. This is indicated (analogous to step 584) by raising PR_SKIP at time T4.

At time T5, PR_SKIP is lowered and the address indicted by SMI_CAD ARY[4:0] is incremented to indicate CAD4 (analogous to step 586). Subsequently, the shadow latches will be loaded (analogous to step 578), as indicated by the four pulses of SMI_TL_WE shortly after T5. As discussed above, during the first and third pulse, SMI_CNT_ADR is low and during the second and fourth pulse SMI_CNT_ADR is high. During the first two pulses, SMI_WDXSAE is high and during the last two pulses SMI_WDXSAE is low. During that period between T5 and T6, page register 120 is evaluating the data for CAD4 (see step 578). In this example, page register 120 determines (based on the information in error register 346) that the data to be programmed into CAD4 does not match all of the data being stored in CAD4. For example, one or more bits are different. Therefore PR_SKIP remains low and the system will wait for the programming of CAD0 to complete (step 588). At time T6, the data that was programmed into CAD0 is sent back to Read Latches RL (step 590). This is evidenced by the two pulses of SMI_TL_RE (the latch enable signal for RL). During the first pulse of SMI_TL_RE, the signal SMI_CNT_ADR is low and during the second pulse SMI_CNT_ADR is high so that each grouping of support circuits will have the data sent to the appropriate Read Latches RL. During that time of the two pulses on SMI_TL_RE, the signal SMI_TL_RXW is set high to indicate that the data on the bus PR_OUT[15:0] is from the Read Latches RL to the page register 120. By time T8, all the read data has been received by page register 120 and is stored in data register 344. The data read will be transferred to shadow register 342 and (potentially) transferred to the state machine 306 and/or controller 134. At time T6, the data for CAD4 (which is in the shadow latches WDL) is transferred to the data latches WSL, analogous to step 574. At time T8, the current column address for programming, SMI_CAD[4:0], is incremented to indicate the column to be programmed. In this example, SMI_CAD[4:0] will be set to CAD4. Additionally, at time T8, the column to be evaluated is incremented so that SMI_CAD ARY[4:0] is set to CAD5. This process will then continue, as described in FIG. 14.

In the example described, a stripe has 32 blocks of data, 32 sense amplifiers and 32 groupings of support circuits for associated blocks. In that same example the bus PR_OUT[15:0] included 16 bits; therefore, the 32 sets of latches had to be loaded in two cycles. Once the two cycles of loading were completed, 32 bits were programmed by the 32 sense amplifiers simultaneously.

In another embodiment, the system may try to reduce power by using less than 32 sense amplifiers simultaneously. For example, the system may only use 16 of the 32 sense amplifies simultaneously. In such an example, two programming cycles need to be performed in order to program all 32 bits addressed in a stripe for a column. During the first programming cycle of the column, the first 16 sense amplifiers would program their respective bits and during the second programming cycle the second 16 sense amplifiers would program their respective bits. The two program cycles are referred to as sense amplifier cycles. For purposes of this document, sense amplifier cycles will be abbreviated as SAD cycles.

In another example, the system may only use 8 sense amplifiers simultaneously for a given stripe. Therefore, four SAD cycles are implemented for each column. In another example, the system could be limited to only using 4 sense amplifiers at a time; therefore, there would need to be 8 SAD cycles for each column. In other embodiments, different numbers of sense amplifiers can be used and the appropriate number of SAD cycles will be used.

Figure 16:
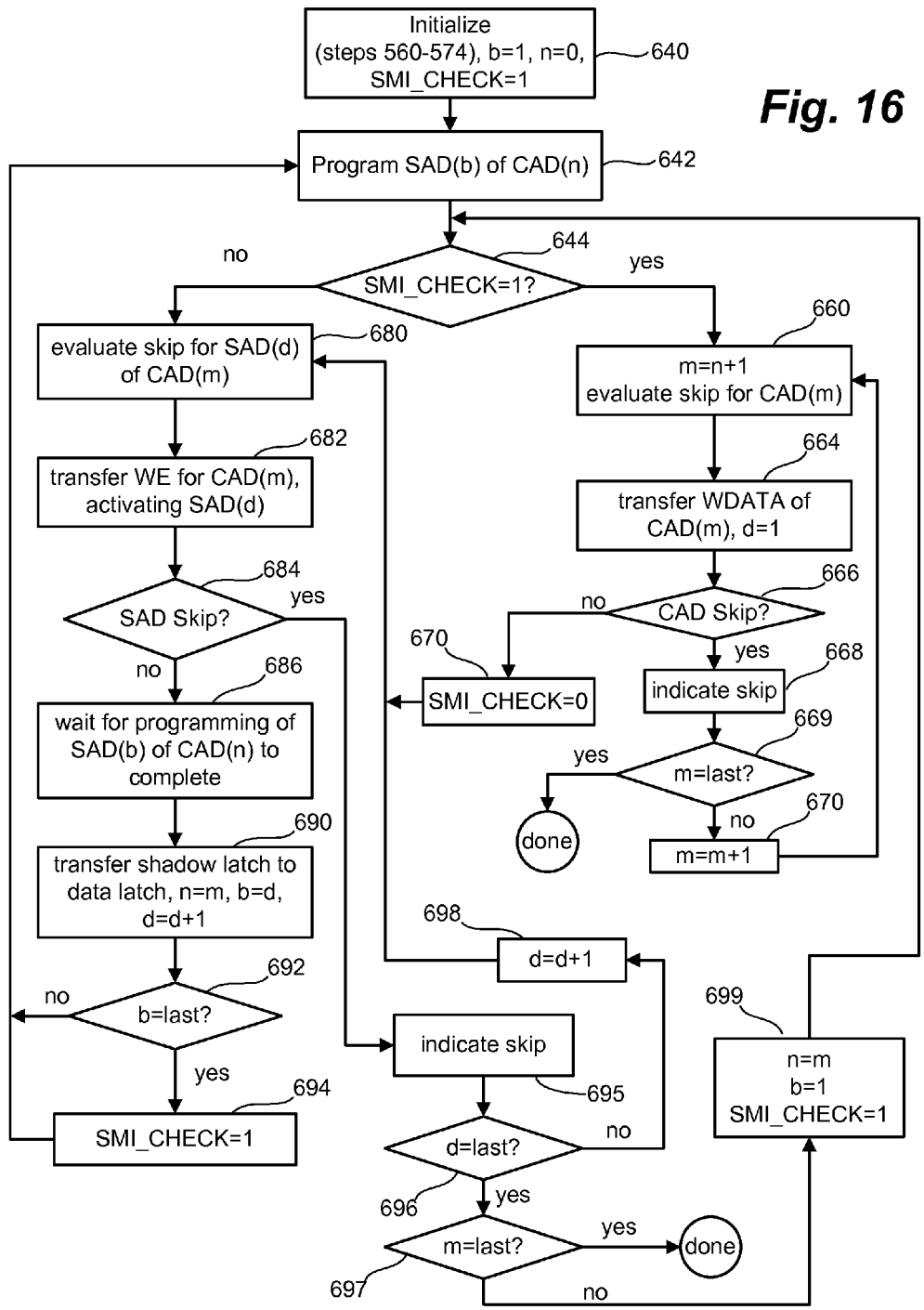
FIG. 16 is a flow chart describing one embodiment of a process for programming data that includes skipping cycles.

When evaluating data for a column to determine whether to skip programming for that column, there may be instances when page register 120 determines that the column cannot be skipped because one or more bits of data are different than what is already stored in memory. In those cases, the page register can also attempt to evaluate the data for each SAD cycle with the goal of skipping those SAD cycles that have the corresponding bits of data to be programmed matching the data already stored in the corresponding memory cells. Therefore, if the system determines that the entire column can be skipped, the system will skip the column. If the system determines that the column cannot be skipped, the system will then look at the data for each SAD cycle and skip those SAD cycles where the corresponding data to be programmed matches the corresponding data stored in the memory cells. FIG. 16 is a flow chart that describes such a process.

In the example process of FIG. 16, it is assumed that each block has 32 columns; therefore, the signal SMI_CAD [4:0] will address CAD0-CAD31. Additionally, for each column, there are four SAD cycles: SAD1, SAD2, SAD3 and SAD4. In step 640 of FIG. 16, the initial set of steps are performed, including performing steps 560-574 of FIG. 14. In addition, the variable b is initialized at 1, the variable n is initialized at 0, and SMI_CHECK is set to 1. The variable b is used to indicate the current SAD cycle. The variable n is used to indicate the current CAD cycle or column address. The variable SMI_CHECK is used to indicate whether to evaluate for a column (CAD) skip or a SAD skip.

In step 642, the system will perform a program operation for the current SAD cycle of the current column. As indicated by FIG. 16, the system will perform programming for SAD (b) of CAD(n). In step 644, it is determined whether the variable SMI_CHECK=1. If so, the process continues at step 660. If not, the process continues at step 680. At the beginning of a new column, SMI_CHECK will be set to 1 so that the column skip is evaluated first. If the column skip evaluation indicates that the column should not be skipped, then SMI_CHECK will be set to 0 so that SAD cycle skips can be evaluated. In the discussion above, since this is the first column being checked, and the process is at the beginning of the column check, SMI_CHECK is set to 1 and the process of FIG. 16 will continue at step 660.

In step 660, the variable m will be set to n+1. Page register 120 will evaluate whether to skip the next column. Page register 120 will evaluate CAD(m), where m=n+1, and n is the current column address. Step 660 is performed by page register 120 checking error register 346, as described above. In step 664, the write data is transferred for the next column CAD(m) from the data register 304 to the appropriate write shadow registers WSL. In one embodiment, steps 660 and 664 performed concurrently. In other embodiments, they have performed consecutively, in either order. The variable d (described below) is initialized at 1. If page register 120 determines that the next column should be skipped (step 666), then in step 668 page register 120 will indicate to other components (including state machine 306) that the next column should be skipped. If CAD(m) is the last column to be programmed (step 669), then the process is completed; otherwise the variable m (column address) is incremented in step 670 and the process loops back to step 660 to evaluate whether to skip the subsequent column. For example, if step 660 was evaluating CAD1 and page register 120 determines that CAD1 should be skipped, when the process loops back to step 660 page register will evaluate whether to skip column CAD22. Page register 120 will keep evaluating columns without waiting for the current column to finish programming, until a column should not be skipped. When page register 120 determines that a column should not be skipped (666), then the variable SMI_CHECK is reset to 0 in step 670 (from step 666) and the process continues as step 680. At this point, it is determined that the next column cannot be skipped.

In step 680, page register 120 will evaluate whether the next SAD cycle will be skipped. The next SAD cycle is noted as SAD(d) of CAD(m). Step 680 includes comparing the appropriate bits of error register 346 that are associated with the sense amplifiers of SAD cycle SAD(d). In step 682, the Sense Amp Enable information for SAD(d) of CAD(m) is transferred to the Sense Amp Enable Shadow Latches SSL. In one embodiment, all the SSL latches will be receiving data. However, that data will indicate not to program for latches that are not in the selected group of sense amplifiers for SAD(d) of CAD(m). In one embodiment, steps 680 and 682 can be performed simultaneously. In other embodiments, they can be performed consecutively in either order.

If the next SAD cycle should be skipped (step 684), then the page register indicates to other components that the next SAD cycle should be skipped in step 695. In some embodiments, step 695 is not needed. In step 696, it is determined whether SAD(d) of CAD(m), the SAD cycle to be skipped, is the last SAD cycle of column CAD(m). If SAD(d) is the last SAD cycle of column CAD(m), then in step 697 it is determined whether CAD(m) is the last column to be programmed. If CAD(m) is the last column to be programmed, then the process is complete; otherwise, the variables are set in step 699 as n=m, b=1 and SMI_CHECK=1. This has the effect of incrementing to the first SAD cycle of the next column. After step 699, the process continues at step 644. If, in step 696, it is determined that SAD(d) is not the last SAD cycle of column CAD(m), then in step 698 d is incremented by 1 in order to address the next SAD cycle of CAD(m). After step 698, the process continue at step 680 and the next SAD cycle is evaluated.

If the next SAD cycle should not be skipped (step 684), then the system will wait for the current SAD cycle being programmed to complete programming in step 686. In step 690, the Sense Amp Enable information and write data in the shadow latches SSL and WSL will be transferred to the data latches SDL and WDL. Additionally, the variables will be set as follows: n=m, b=d, d=d+1 (after setting b=d). If the SAD cycle just evaluated in the previous iteration of step 680 was the last SAD cycle for the column, then the process continues to step 694 and the variable SMI_CHECK is set to 1 so that the system will consider the next column. If the SAD cycle evaluated in the previous iteration of step 680 was not the last SAD cycle for the current column, then the process at that step 692 will continue at step 642 to program the next SAD cycle. After step 694, the process will also continue at step 642 to program the next SAD cycle.

Figure 17:
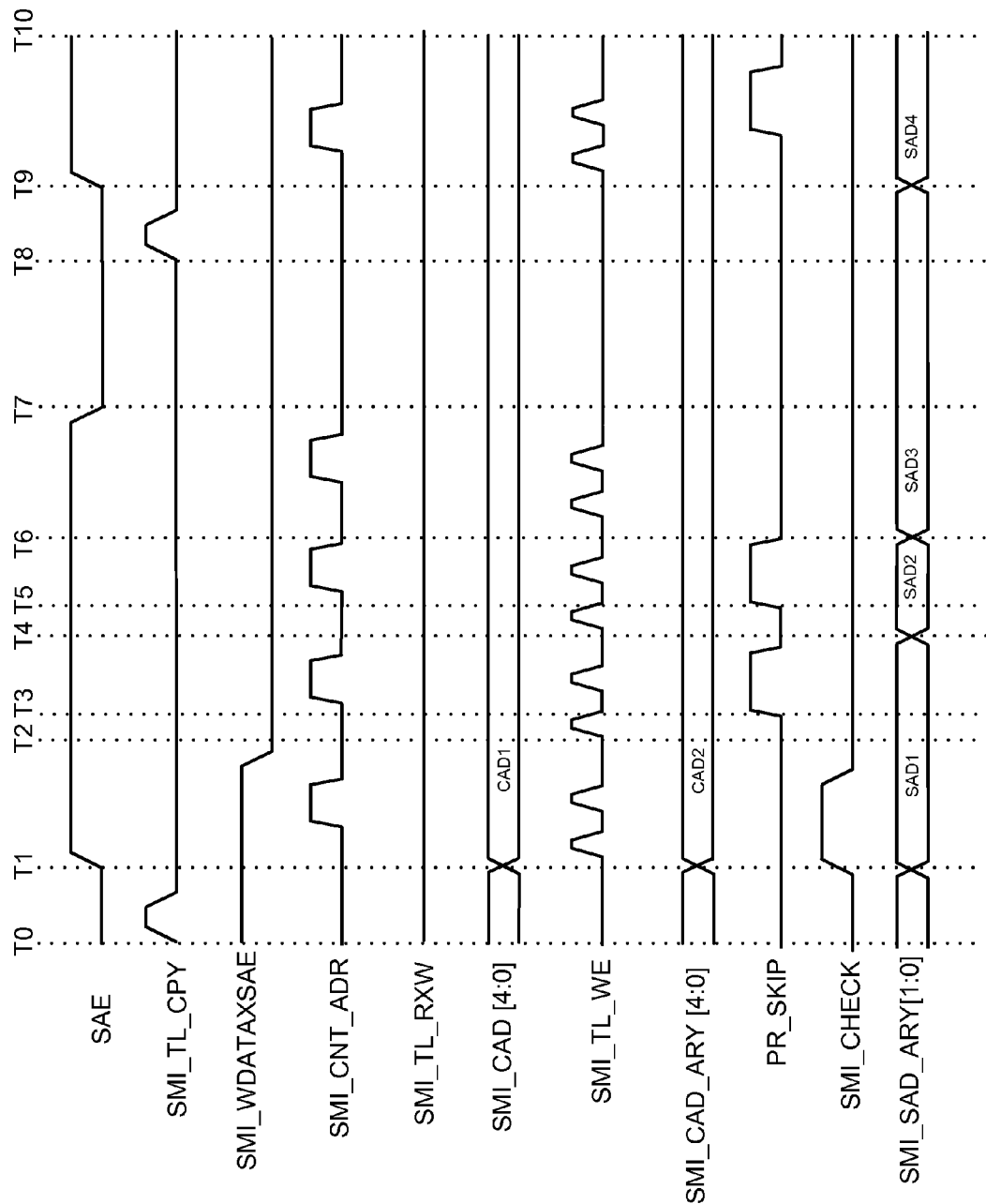
FIG. 17 is a timing diagram describing one embodiment of a process for programming data that includes skipping cycles.

FIG. 17 is a timing diagram which describes the behavior of various signals for one example implementation of the process of FIG. 16. More specifically, the signal diagram of FIG. 17 shows the performance for one particular column that includes one iteration of steps 660-670 and four iterations of steps 680-684. In this example, while data is being programmed for SAD cycle SAD 4 of column CAD1, the system is evaluating whether to skip column CAD2 and the four SAD cycles for column CAD2. As part of this example, the system determines to skip SAD 1, skip SAD 2 and program SAD 3 for column CAD2.

FIG. 17 shows the behavior for the following signals: SAE, SMI_TL_CPY, SMI_WDXSAE, SMI_CNT_ADR, SMI_TL_RXW, SMI_CAD [4:0], SMI_TL WE, SMI_RL_WE, SMI_CAD ARY [4:0], PR_SKIP, SMI_CHECK and SMI_SAD_ARY[1:0]. The signal SMI_SAD_ARY [1:0] indicates the SAD cycle being evaluated for skipping.

At time T0 of FIG. 17, SMI_TL_CPY is pulsed to indicate that data from the shadow latches are transferred to the data latches (WSL and SSL to WDL and SDL). This pulse is part of the performance of step 690 for the current column about to be programmed. In this example, the current column is CAD1. At step T1, SAE is raised high to start the programming process for SAD4 of CAD1 (see step 642). After T1, step 660 of FIG. 16 is performed and page register 120 will evaluate whether to skip the next column. Step 660 was performed because a SMI_CHECK is high. After T1, SMI_TL WE is pulsed twice so that the write data can be transferred to the shadow latches WSL as part of step 664. In this example, page register 120 will determine the next column (CAD2—as indicated by SMI_CAD_ARY[4:0]) should not be skipped. Therefore, SMI_CHECK is lowered (part of step 670) and page register 120 will evaluate whether SAD1 of CAD2 should be skipped.

During the evaluation of SAD1 for CAD2, the signal SMI_TL WE is pulsed twice (right after time T2) in order to transfer the Sense Amp Enable information from page register 120 to the Sense Amp Enable Shadow Latches SSL. During the first pulse, SMI_CNT_ADR is low and during the second pulse of the pair SMI_CNT_ADR is high. In this example, page register 120 determines that SAD1 should be skipped; therefore, PR_SKIP is set high as part of step 695 and page register will then evaluate SAD2. Thus, at time T4, SMI_SAD_ARY [1:0] is changed to SAD2 (analogous to step 698).

Page register will evaluate whether SAD2 should be skipped after T4. While evaluating SAD2, the Sense Amp Enable information will be transferred to the shadow latches SSL, as evidenced by the two pulses on SMI_TL_WE starting at T4. The Sense Amp Enable data for SAD2 will overwrite the Sense Amp Enable data for SAD1. In this example, page register 120 will determine that SAD2 should be skipped; therefore, PR_SKIP is raised high at time T5 (step 695). Although FIG. 17 shows both pulses of SMI_TL_WE, in some embodiments, the transfer will be aborted when PR_SKIP is asserted.

At T6, SMI_SAD_ARY [1:0] will increment to the next SAD cycle, SAD3, and page register 120 will evaluate SAD3 to whether programming of SAD3 can be skipped. While evaluating, the Sense Amp Enable information for SAD3 will be transferred from page register 120 to the Sense Amp Enable Shadow Latches SSL, as evidenced by the two pulses on SMI_TL_WE starting at T4. The Sense Amp Enable information for SAD3 will overwrite the Sense Amp Enable information for SAD2 stored in SSL. In this example, page register 120 will determine that programming for SAD3 should not be skipped; therefore, PR_SKIP will remain low after T6. After determining that SAD3 should be programmed, the system will wait for programming to complete, which occurs shortly after T7.

At time T8, data (used for programming SAD3) from the shadow latches WSL and SSL will be transferred to the data latches WDL and SDL, as depicted by the pulse on SMI_TL_CPY. At time T9, SAE is raised high to start the programming process for SAD3 of CAD2 (see step 642 of FIG. 16). After T9 and while programming SAD3 of CAD2, page register 120 will evaluate whether to skip SAD4 of CAD2. Concurrently, the Sense Amp Enable information will be transferred for SAD4, as depicted by the two pulses on SMI_TL_WE after time T9. In this example, page register determines to skip SAD4 and PR_SKIP is asserted high between T9 and T10.

One embodiment includes programming a current subset of data from an intermediate storage device into an associated subset of non-volatile storage elements; while programming the current subset of data, evaluating whether two or more additional subsets of the data stored in the intermediate storage device should be programmed into respective subsets of the non-volatile storage elements; and programming a particular subset of data of the two or more additional subsets of the data into a particular subset of the non-volatile storage elements if the evaluating determined that the particular subset of data should be programmed.

One embodiment includes programming a current subset of data from an intermediate storage device into an associated subset of non-volatile storage elements; without waiting for completion of the programming the current subset of data from the intermediate storage device into the associated subset of non-volatile storage elements, evaluating whether two or more additional subsets of the data stored in the intermediate storage device should be programmed into respective subsets of the non-volatile storage elements; and programming a particular subset of data of the two or more additional subsets of the data into a particular subset of the non-volatile storage elements if the evaluating determined that the particular subset of data should be programmed.

One embodiment includes programming a first subset of data stored in an intermediate storage device into a first subset of the non-volatile storage elements; without waiting for completion of the programming of the first subset of the data, evaluating whether a second subset of the data stored in the intermediate storage device should be programmed into a second subset of the non-volatile storage elements and determining that the second subset of the data should not be programmed into the second subset of the non-volatile storage elements; without waiting for completion of the programming of the first subset of the data and after determining that the second subset of the data should not be programmed into the second subset of the non-volatile storage elements, evaluating whether an additional subset of the data stored in the intermediate storage device should be programmed into an additional subset of the non-volatile storage elements; and programming the additional subset of the data into the additional subset of the non-volatile storage elements if the evaluating of the additional subset of the data determined that the additional subset of the data should be programmed into the additional subset of the non-volatile storage elements.

One embodiment includes storing data in an intermediate storage device; transferring a first subset of the data from the intermediate storage device to a set of temporary storage devices; programming the first subset of the data stored in the set of temporary storage devices into a first subset of the non-volatile storage elements; without waiting for completion of the programming of the first subset of the data into the first subset of non-volatile storage elements, evaluating whether a second subset of the data stored in the intermediate storage device should be programmed into a second subset of the non-volatile storage elements; prior to completion of the evaluating of the second subset of data and without waiting for completion of the programming of the first subset of the data into the first subset of non-volatile storage elements, commencing transfer of the second subset of the data from the intermediate storage device to the set of temporary storage devices; and programming the second subset of the data into the second subset of the non-volatile storage elements if the evaluating of the second subset of data determined that the second subset of the data should be programmed into the second subset of the non-volatile storage elements.

One embodiment includes a plurality of non-volatile storage elements and one or more managing circuits in communication with the non-volatile storage elements. The one or more managing circuits program a first subset of data into a first subset of non-volatile storage elements. Without waiting for completion of the programming of the first subset of data, the one or more managing circuits evaluate whether two or more additional subsets of the data should be programmed into respective subsets of the non-volatile storage elements. The one or more managing circuits program a particular subset of data of the two or more additional subsets of the data into a particular subset of the non-volatile storage elements if the evaluation determined that the particular subset of data should be programmed.

One embodiment includes a substrate, a plurality of non-volatile storage elements arranged above the substrate, a plurality of sense amplifiers in communication with the non-volatile storage elements, a plurality of temporary storage devices in communication with the sense amplifiers, an intermediate register in communication with the temporary storage devices, and one or more control circuits in communication with the temporary storage devices and the sense amplifiers. The one or more control circuits are also in communication with the intermediate register. The temporary storage devices are arranged on the substrate underneath the non-volatile storage elements. The sense amplifiers are arranged on the substrate underneath the non-volatile storage elements. The intermediate register is arranged on the substrate in an area that is not underneath the non-volatile storage devices. A set of data is stored in the intermediate register. A first subset of the data is transferred into a subset of the temporary registers and then stored in a first subset of the non-volatile storage elements. While programming the first subset of data, two or more additional subsets of the data stored in the intermediate storage device are evaluated to determine whether they should be programmed into respective subsets of the non-volatile storage elements. A particular subset of data of the two or more additional subsets of the data is programmed into a particular subset of the non-volatile storage elements if the evaluating determined that the particular subset of data should be programmed.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for programming non-volatile storage elements, comprising:
   programming a current subset of data from an intermediate storage device into an associated subset of non-volatile storage elements;
   while programming the current subset of data, evaluating whether two or more additional subsets of the data stored in the intermediate storage device should be programmed into respective subsets of the non-volatile storage elements; and
   programming a particular subset of data of the two or more additional subsets of the data into a particular subset of the non-volatile storage elements if the evaluating determined that the particular subset of data should be programmed.

2. The method of claim 1, further comprising:
   receiving the data with a request to program the data; and
   storing the data in the intermediate register;
   wherein the programming of the current subset of data includes transferring the current subset of the data from the intermediate storage device to a set of temporary shadow storage devices, transferring the current subset of data from the set of temporary shadow storage devices to a set of temporary data storage devices, and transferring the data from the set of temporary data storage devices to the associated subset of non-volatile storage elements.

3. The method of claim 1, wherein:
   the method further includes receiving the data with a request to program the data and
   storing the data in the intermediate register;
   the non-volatile storage elements are arranged above a substrate;
   the intermediate register is arranged on the substrate in an area that is not underneath the non-volatile storage elements;
   the programming of the current subset of data includes transferring the current subset of data from the intermediate storage device to a set of temporary shadow storage devices, transferring the current subset of the data from the set of temporary shadow storage devices to a set of temporary data storage devices, and transferring the data from the set of temporary data storage devices to the associated subset of non-volatile storage elements; and
   the set of temporary shadow storage devices and the set of temporary data storage devices are arranged on the substrate underneath the non-volatile storage elements.

4. The method of claim 1, further comprising:
   receiving the data with a request to program the data; and
   storing the data in the intermediate register, the data stored in the intermediate register is a logical page of data to be programmed as a unit, the intermediate register is a page register.

5. The method of claim 1, wherein:
   the associated subset of non-volatile storage elements comprise one column of non-volatile storage elements in a plurality of non-volatile storage elements;
   the particular subset of non-volatile storage elements comprise another column of non-volatile storage elements in the plurality of non-volatile storage elements;
   each subset of data of the two or more additional subsets of the data are associated with different columns of non-volatile storage elements; and
   the evaluating includes determining whether to skip programming for one or more of the columns of non-volatile storage elements.

6. The method of claim 1, wherein:
the associated subset of non-volatile storage elements are part of one column of non-volatile storage elements in a plurality of non-volatile storage elements;
each subset of data of the two or more additional subsets of the data are associated with non-volatile storage elements in a particular column;
each subset of data of the two or more additional subsets of the data are associated with different subsets of sense amplifiers; and
the evaluating includes determining whether to skip programming for one or more of the subsets of sense amplifiers.

7. The method of claim 1, wherein:
the evaluating whether two or more additional subsets of the data stored in the intermediate storage device should be programmed into respective subsets of the non-volatile storage elements includes determining whether the two or more additional subsets of the data stored in the intermediate storage device match information stored in the respective subsets of the non-volatile storage elements.

8. A method for programming non-volatile storage elements, comprising:
programming a current subset of data from an intermediate storage device into an associated subset of non-volatile storage elements;
without waiting for completion of the programming the current subset of data from the intermediate storage device into the associated subset of non-volatile storage elements, evaluating whether two or more additional subsets of the data stored in the intermediate storage device should be programmed into respective subsets of the non-volatile storage elements; and
programming a particular subset of data of the two or more additional subsets of the data into a particular subset of the non-volatile storage elements if the evaluating determined that the particular subset of data should be programmed.

9. The method of claim 8, further comprising:
receiving the data with a request to program the data; and
storing the data in the intermediate register;
wherein the programming of the current subset of data includes transferring the current subset of the data from the intermediate storage device to a set of temporary shadow storage devices, transferring the current subset of data from the set of temporary shadow storage devices to a set of temporary data storage devices, and transferring the data from the set of temporary data storage devices to the associated subset of non-volatile storage elements.

10. The method of claim 8, wherein:
the method further includes receiving the data with a request to program the data and storing the data in the intermediate register;
the non-volatile storage elements are arranged above a substrate;
the intermediate register is arranged on the substrate in an area that is not underneath the non-volatile storage elements;
the programming of the current subset of data includes transferring the current subset of data from the intermediate storage device to a set of temporary shadow storage devices, transferring the current subset of the data from the set of temporary shadow storage devices to a set of temporary data storage devices, and transferring the data from the set of temporary data storage devices to the associated subset of non-volatile storage elements; and
the set of temporary shadow storage devices and the set of temporary data storage devices are arranged on the substrate underneath the non-volatile storage elements.

11. The method of claim 8, further comprising:
receiving the data with a request to program the data; and
storing the data in the intermediate register, the data stored in the intermediate register is a logical page of data to be programmed as a unit, the intermediate register is a page register.

12. The method of claim 8, wherein:
the associated subset of non-volatile storage elements comprise one column of non-volatile storage elements in a plurality of non-volatile storage elements;
the particular subset of non-volatile storage elements comprise another column of non-volatile storage elements in the plurality of non-volatile storage elements;
each subset of data of the two or more additional subsets of the data are associated with different columns of non-volatile storage elements; and
the evaluating includes determining whether to skip programming for one or more of the columns of non-volatile storage elements.

13. The method of claim 8, wherein:
the associated subset of non-volatile storage elements are part of one column of non-volatile storage elements in a plurality of non-volatile storage elements;
each subset of data of the two or more additional subsets of the data are associated with non-volatile storage elements in a particular column;
each subset of data of the two or more additional subsets of the data are associated with different subsets of sense amplifiers; and
the evaluating includes determining whether to skip programming for one or more of the subsets of sense amplifiers.

14. The method of claim 8, wherein:
the evaluating whether two or more additional subsets of the data stored in the intermediate storage device should be programmed into respective subsets of the non-volatile storage elements includes determining whether the two or more additional subsets of the data stored in the intermediate storage device match information stored in the respective subsets of the non-volatile storage elements.

15. A non-volatile storage apparatus, comprising:
a plurality of non-volatile storage elements; and
one or more managing circuits in communication with the non-volatile storage elements, the one or more managing circuits program a first subset of data into a first subset of non-volatile storage elements, without waiting for completion of the programming of the first subset of data the one or more managing circuits evaluate whether two or more additional subsets of the data should be programmed into respective subsets of the non-volatile storage elements, the one or more managing circuits program a particular subset of data of the two or more additional subsets of the data into a particular subset of the non-volatile storage elements if the evaluation determined that the particular subset of data should be programmed.

16. The non-volatile storage apparatus of claim 15, wherein:
the first subset of non-volatile storage elements comprise one column of non-volatile storage elements in the plurality of non-volatile storage elements;

each subset of the respective subsets of the non-volatile storage elements comprise different columns of the plurality of non-volatile storage elements; and the evaluating includes determining whether to skip programming for one or more of the columns of non-volatile storage elements.

17. The non-volatile storage apparatus of claim 15, wherein:

the first subset of non-volatile storage elements is part of one column of non-volatile storage elements in the plurality of non-volatile storage elements;

each subset of the respective subsets of the non-volatile storage elements are part of a particular column of non-volatile storage elements in the plurality of non-volatile storage elements;

the apparatus further comprises sense amplifiers;

each subset of the respective subsets of the non-volatile storage elements are associated with different subsets of sense amplifiers; and the evaluating includes determining whether to skip programming for one or more of the subsets of sense amplifiers.

18. A non-volatile storage apparatus, comprising:

a substrate;

a plurality of non-volatile storage elements arranged above the substrate;

a plurality of sense amplifiers in communication with the non-volatile storage elements, the sense amplifiers are arranged on the substrate underneath the non-volatile storage elements;

a plurality of temporary storage devices in communication with the sense amplifiers, the temporary storage devices are arranged on the substrate underneath the non-volatile storage elements;

an intermediate register in communication with the temporary storage devices, the intermediate register is arranged on the substrate in an area that is not underneath the non-volatile storage devices; and one or more control circuits in communication with the temporary storage devices and the sense amplifiers and the intermediate register, a set of data is stored in the intermediate register, a first subset of the data is transferred into a subset of the temporary registers and then stored in a first subset of the non-volatile storage elements, while programming the first subset of data two or more additional subsets of the data stored in the intermediate storage device are evaluated to determine whether they should be programmed into respective subsets of the non-volatile storage elements, a particular subset of data of the two or more additional subsets of the data is programmed into a particular subset of the non-volatile storage elements if the evaluating determined that the particular subset of data should be programmed.

19. The non-volatile storage apparatus of claim 18, wherein:

the particular subset of data is transferred from the intermediate register to the subset of the temporary registers while evaluating whether to program the particular subset of data.

20. The non-volatile storage apparatus of claim 18, wherein:

the additional subsets of the data stored in the intermediate storage device are evaluated by determining whether they match information stored in respective subsets of the non-volatile storage elements.

21. The non-volatile storage apparatus of claim 18, wherein:

the first subset of non-volatile storage elements comprise one column of non-volatile storage elements in the plurality of non-volatile storage elements;

each subset of the respective subsets of the non-volatile storage elements comprise different columns of the plurality of non-volatile storage elements; and the evaluating includes determining whether to skip programming for one or more of the columns of non-volatile storage elements.

22. The non-volatile storage apparatus of claim 18, wherein:

each subset of the respective subsets of the non-volatile storage elements are associated with different subsets of sense amplifiers; and the evaluating includes determining whether to skip programming for one or more of the subsets of sense amplifiers.

23. The non-volatile storage apparatus of claim 18, wherein:

the intermediate register is a page register; and the first subset of data and the additional subsets of the data are part of the same page of data stored in the page register.

* * * * *